US012775097B2

(12) United States Patent
Kim et al.

(10) Patent No.: US 12,775,097 B2
(45) Date of Patent: Oct. 27, 2026

(54) TUNABLE LASER LIGHT SOURCE AND LiDAR APPARATUS INCLUDING THE SAME

(71) Applicant: SAMSUNG ELECTRONICS CO., LTD., Suwon-si (KR)

(72) Inventors: Woosung Kim, Suwon-si (KR); Dongjae Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 620 days.

(21) Appl. No.: 18/224,270

(22) Filed: Jul. 20, 2023

(65) Prior Publication Data

US 2024/0201387 A1 Jun. 20, 2024

(30) Foreign Application Priority Data

Dec. 19, 2022 (KR) ........................ 10-2022-0178685

(51) Int. Cl.
*G01S 17/931* (2020.01)
*H01S 5/024* (2006.01)
(Continued)

(52) U.S. Cl.
CPC ............ *G01S 17/931* (2020.01); *H01S 5/024* (2013.01); *H01S 5/1003* (2013.01); *H01S 5/1071* (2013.01); *H01S 5/5027* (2013.01)

(58) Field of Classification Search
CPC ...... G01S 17/931; G01S 17/86; G01S 7/4814; G01S 7/4817; G01S 17/42; H01S 5/024;
(Continued)

(56) References Cited

U.S. PATENT DOCUMENTS 6,278,170 B1 * 8/2001 Komatsu ............... G02F 1/2257 257/458
6,625,187 B1 * 9/2003 Ikoma .................... B82Y 20/00 257/14

(Continued)

FOREIGN PATENT DOCUMENTS

EP 3 958 412 A1 2/2022
KR 10-2017-0105999 A 9/2017
KR 10-2022-0037928 A 3/2022

OTHER PUBLICATIONS

Communication issued Mar. 7, 2024 by the European Patent Office in European Patent Application No. 23198202.6.

*Primary Examiner* — Md Saiful A Siddiqui
(74) *Attorney, Agent, or Firm* — Sughrue Mion, PLLC

(57) ABSTRACT

A tunable laser light source includes a substrate; a waveguide layer disposed on the substrate, and including: a first optical waveguide and a second optical waveguide that are spaced apart from each other in a first direction and that extend in a second direction perpendicular to the first direction; a first optical amplifier provided on the first optical waveguide; a second optical amplifier provided on the second optical waveguide and facing the first optical amplifier at a distance in the first direction; and a thermal isolation structure that is provided between the first optical amplifier and the second optical amplifier in the first direction, wherein, in the thermal isolation structure, the waveguide layer is disconnected in the first direction such that an upper surface of the substrate is exposed outside of the waveguide layer.

19 Claims, 14 Drawing Sheets

(51) Int. Cl.
*H01S 5/10* (2021.01)
*H01S 5/50* (2006.01)

(58) Field of Classification Search
CPC .... H01S 5/1003; H01S 5/1071; H01S 5/5027; H01S 5/0612; H01S 5/1032; H01S 5/142; H01S 5/20; H01S 5/50; H01S 3/08072; H01S 3/04; H01S 3/083
See application file for complete search history.

(56) References Cited

U.S. PATENT DOCUMENTS

| | | | | |
|---|---|---|---|---|
| 6,952,504 | B2 | 10/2005 | Bi et al. | |
| 8,110,823 | B2 | 2/2012 | Bowers | |
| 10,126,412 | B2 | 11/2018 | Eldada et al. | |
| 10,355,448 | B2 * | 7/2019 | Sugiyama | H01S 5/101 |
| 11,070,027 | B2 | 7/2021 | Ueno et al. | |
| 11,211,767 | B2 | 12/2021 | Wu et al. | |
| 2017/0264079 | A1 | 9/2017 | Oh | |
| 2018/0366901 | A1 * | 12/2018 | Shim | H01S 5/02453 |
| 2019/0013640 | A1 * | 1/2019 | Cheung | H01S 5/4062 |
| 2019/0391459 | A1 | 12/2019 | Shin et al. | |
| 2020/0103679 | A1 * | 4/2020 | Lee | H01S 5/4062 |
| 2020/0124793 | A1 * | 4/2020 | Koda | H01S 5/026 |
| 2020/0386943 | A1 * | 12/2020 | Koshoubu | G02B 6/12011 |
| 2022/0091332 | A1 | 3/2022 | Yoo et al. | |
| 2023/0003848 | A1 * | 1/2023 | Ferrara | G01S 7/4818 |
| 2023/0063732 | A1 | 3/2023 | Shin et al. | |

* cited by examiner

TUNABLE LASER LIGHT SOURCE AND LiDAR APPARATUS INCLUDING THE SAME

CROSS-REFERENCE TO RELATED APPLICATION

This application is based on and claims priority under 35 U.S.C. § 119 to Korean Patent Application No. 10-2022-0178685, filed on Dec. 19, 2022, in the Korean Intellectual Property Office, the disclosure of which is incorporated by reference herein in its entirety.

BACKGROUND

1. Field

The disclosure relates to a tunable laser light source and a light detection and ranging (LiDAR) apparatus including the same.

2. Description of the Related Art

Recently, advanced driving assistance systems (ADAS) having various functions have been commercialized. For example, there has been an increased number of vehicles equipped with functions such as Adaptive Cruise Control (ACC), which reduces the speed of a vehicle if there is a risk of collision while maintaining a set speed range if there is no risk of collision by recognizing the location and speed of other vehicles. Another example is Autonomous Emergency Braking System (AEB), which automatically applies brakes to prevent collisions when there is a risk of collision with another vehicle in front and the driver does not respond to the risk or inappropriately responds. In addition, the commercialization of autonomous driving is expected to happen in the near future.

Accordingly, the importance of a vehicle radar that provides information about a vehicle's surroundings is gradually increasing. For example, light detection and ranging (LiDAR) devices that measure a distance, speed, azimuth, and position of an object from the time when a laser scattered or reflected therefrom returns, changes in the intensity of the laser, changes in the frequency of the laser, and changes in the polarization state of the laser are widely used as vehicle radars.

SUMMARY

One or more example embodiments provide a tunable laser light source capable of reducing or minimizing performance degradation caused by thermal degradation, along with a light detection and ranging (LiDAR) apparatus including the tunable laser light source.

Additional aspects will be set forth in part in the description which follows and, in part, will be apparent from the description, or may be learned by practice of the presented embodiments of the disclosure.

According to an aspect of the disclosure, a tunable laser light source includes a substrate; a waveguide layer disposed on the substrate and including a first optical waveguide and a second optical waveguide that are spaced apart from each other in a first direction and that extend in a second direction perpendicular to the first direction; a first optical amplifier provided on the first optical waveguide; a second optical amplifier disposed on the second optical waveguide and facing the first optical amplifier at a distance in the first direction; and a thermal isolation structure that is disposed between the first optical amplifier and the second optical amplifier in the first direction, wherein, in the thermal isolation structure, the waveguide layer is disconnected in the first direction so that an upper surface of the substrate is exposed outside of the waveguide layer.

A length of the thermal isolation structure in the second direction may be greater than a length of the first optical amplifier in the second direction and a length of the second optical amplifier in the second direction.

A first end of the thermal isolation structure may protrude in the second direction beyond a first end of the first optical amplifier and a first end of the second optical amplifier, and a second end of the isolation structure, which is opposite to the first end, may protrude in the second direction beyond a second end of the first optical amplifier and a second end of the second optical amplifier.

The tunable laser light source may further include a first ring resonator disposed to face the first end of the thermal isolation structure in the second direction between the first and second optical waveguides in the first direction, and a second ring resonator disposed to face the second end of the thermal isolation structure opposite to the first end in the second direction between the first and second optical waveguides in the first direction.

A distance between the first end of the thermal isolation structure and the first ring resonator in the second direction may be less than a distance between the first end of the first optical amplifier and the first ring resonator and a distance between the first end of the second optical amplifier and the first ring resonator, and a distance between the second end of the thermal isolation structure and the second ring resonator in the second direction may be less than a distance between the second end of the first optical amplifier and the second ring resonator and a distance between the second end of the second optical amplifier and the second ring resonator.

The thermal isolation structure may have a first thermal isolation structure disposed between a first side surface of the first optical amplifier and a first side surface of the second optical amplifier in the first direction, wherein the tunable laser light source may further include: a second thermal isolation structure disposed near a second side of the first optical amplifier opposite the first side of the first optical amplifier in the first direction and extending in the second direction; a third thermal isolation structure disposed near a second side surface of the second optical amplifier opposite the first side surface of the second optical amplifier in the first direction and extending in the second direction; a fourth thermal isolation structure disposed to face a side surface of the first ring resonator in the second direction; and a fifth thermal isolation structure disposed to face a side surface of the second ring resonator in the second direction.

The first thermal isolation structure, the second thermal isolation structure, and the third thermal isolation structure may be spaced apart from each other with an interval and are parallel to one another in the first direction, wherein a length of the second thermal isolation structure in the second direction and a length of the third thermal isolation structure in the second direction are greater than a length of the first thermal isolation structure in the second direction.

The first ring resonator may be disposed between the first thermal isolation structure and the fourth thermal isolation structure in the second direction, and the second ring resonator may be disposed between the first thermal isolation structure and the fifth thermal isolation structure in the second direction.

The thermal conductivity of the thermal isolation structure may be less than the thermal conductivity of the waveguide layer.

The tunable laser light source may further include a cladding layer on the waveguide layer, wherein the thermal isolation structure may be a region filled with the cladding layer between the first and second optical amplifiers.

In the thermal isolation structure, an upper surface of the substrate and the cladding layer may be in direct contact with each other.

The cladding layer may have a refractive index less than a refractive index of the waveguide layer, and the cladding layer may have a thermal conductivity less than a thermal conductivity of the waveguide layer.

The first optical amplifier may include a first lower contact layer disposed on the first optical waveguide, a first gain material layer disposed on the first lower contact layer, and a first upper contact layer disposed on the first gain material layer, and the second optical amplifier may include a second lower contact layer disposed on the second optical waveguide, a second gain material layer disposed on the second lower contact layer, and a second upper contact layer disposed on the second gain material layer.

The tunable laser light source may further include a thermal management device disposed in contact with the first upper contact layer and the second upper contact layer.

The tunable laser light source may further include: a thermal management device disposed on a lower surface of the substrate; a first thermal conductive plug connected between the first lower contact layer and the thermal management device and extending in the third direction perpendicular to the first and second directions; a second thermal conductive plug connected between the first upper contact layer and the thermal management device and extending in the third direction; a third thermal conductive plug connected between the second lower contact layer and the thermal management device and extending in the third direction; and a fourth thermal conductive plug connected between the second upper contact layer and the thermal management device and extending in a third direction, wherein the thermal management device may be configured to individually cool the first to fourth thermal conductive plugs.

The tunable laser light source may further include: a thermal management device disposed on a lower surface of the substrate; a first thermal conductive member extending between the thermal management device and the first optical waveguide through the substrate in the third direction perpendicular to the first and second directions; and a second thermal conductive member extending between the thermal management device and the second optical waveguide through the substrate in the third direction perpendicular to the first and second directions.

According to another aspect of the disclosure, a light detection and ranging (LiDAR) apparatus may include: a substrate; a waveguide layer disposed on the substrate, and including a plurality of pairs of optical amplifiers and an optical modulators, wherein the plurality of pairs are arranged in a first direction, and each of the plurality of pairs is arranged in a second direction is perpendicular to the first direction; and a thermal isolation structure configured to thermally isolate the plurality of pairs from each other in the first direction, wherein in the thermal isolation structure, the waveguide layer is disconnected in the first direction by the thermal isolation structure such that an upper surface of the substrate is exposed outside of the waveguide layer.

The thermal isolation structure may be disposed between two adjacent pairs in the first direction among the plurality of pairs.

The thermal isolation structure may be arranged to surround a pair of one optical amplifier and one optical modulator adjacent to each other in the second direction among the plurality of pairs of optical amplifiers and an optical modulators.

According to another aspect of the disclosure, an electronic apparatus may include: a substrate; a waveguide layer disposed on the substrate; and at least two semiconductor elements provided on the waveguide layer and configured to generate heat during operation, wherein the waveguide layer is disconnected between the at least two semiconductor elements to expose the substrate located between the at least two semiconductor elements.

According to another aspect of the disclosure, a LIDAR apparatus includes: a substrate; a waveguide layer disposed on the substrate; a plurality of optical amplifiers arranged at an interval from each other in the first direction on the waveguide layer; a plurality of optical modulators disposed adjacent to a corresponding optical amplifier among the plurality of optical amplifiers on the waveguide layer in the second direction perpendicular to the first direction and spaced apart from each other in the first direction; and a thermal isolation structure configured to thermally isolate the plurality of optical amplifiers and the plurality of optical modulators from each other, wherein in the thermal isolation structure, the waveguide layer is separated in the first direction by the thermal isolation structure so that the upper surface of the substrate is exposed outside the waveguide layer.

In an example, the thermal isolation structure may be disposed between two optical amplifiers adjacent in the first direction among the plurality of optical amplifiers or between two optical modulators adjacent in the first direction among the plurality of optical modulators.

In another example, the thermal isolation structure may be arranged to surround a pair of one optical amplifier and one optical modulator adjacent to each other in the second direction among the plurality of optical amplifiers and the plurality of optical modulators.

According to another aspect of the disclosure, an electronic apparatus includes: a substrate; a waveguide layer disposed on the substrate; and at least two semiconductor element heat-sources disposed adjacent to each other on the waveguide layer and generating heat during operation, wherein a part of the waveguide layer between the at least two semiconductor element heat-sources adjacent to each other may be disconnected to expose the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
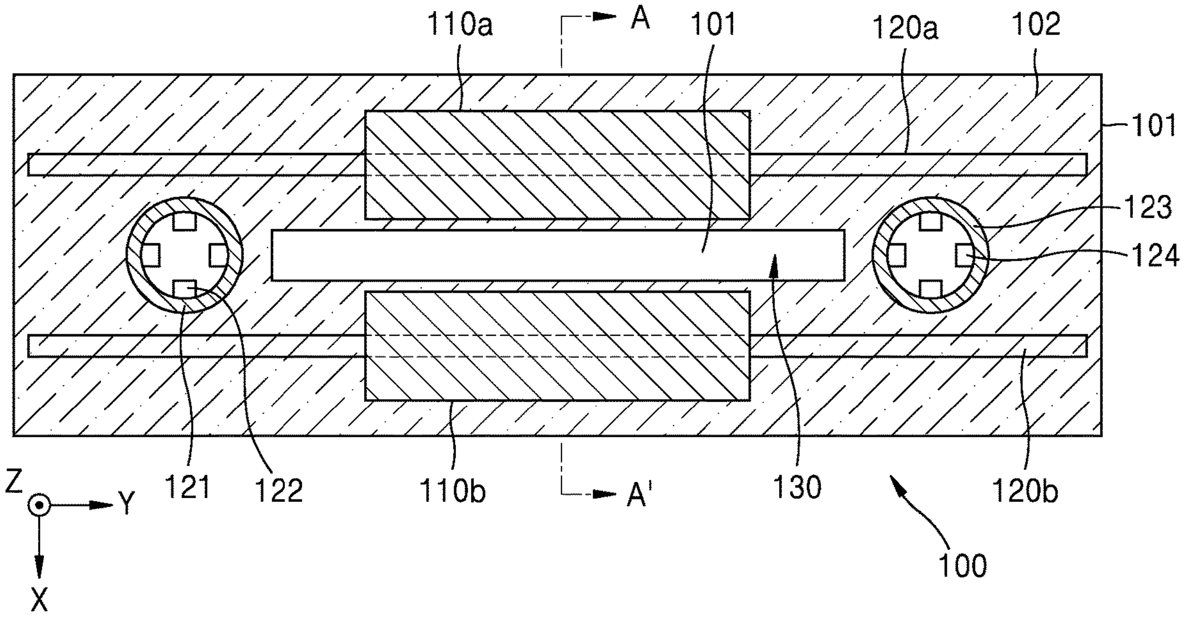
FIG. 1 is a schematic diagram showing a structure of a tunable laser light source according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a tunable laser light source and a light detection and ranging (LIDAR) apparatus including the same will be described in detail with reference to the accompanying drawings. In the drawings, like reference numerals denote like elements and sizes of constituent elements may be exaggerated for convenience of explanation and clarity. The embodiments of the disclosure are capable of various modifications and may be embodied in many different forms.

It will be understood that when an element or layer is referred to as being "on" or "above" another element or layer, the element or layer may be directly on another element or layer or intervening elements or layers. Singular forms are intended to include the plural forms as well unless the context clearly indicates otherwise. When a part "comprises" or "includes" an element in the specification, unless otherwise defined, it is not excluding other elements but may further include other elements.

In the specification, the term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members can be represented by replaceable or additional various functional connections, physical connections, or circuit connections in an actual apparatus.

The use of any and all examples, or exemplary language provided herein, is intended merely to better illuminate the disclosure and does not pose a limitation on the scope of the disclosure unless otherwise claimed.

FIG. 1 is a schematic diagram showing a structure of a tunable laser light source 100 according to an embodiment. Referring to FIG. 1, a tunable laser light source 100 may include a first optical waveguide **120*a* and a second optical waveguide 120*b* arranged parallel to each other on a substrate 101, a first optical amplifier 110*a* provided on the first optical waveguide 120*a*, a second optical amplifier 110*b* provided on the second optical waveguide 120*b*, a first ring resonator 121 and a second ring resonator 123 provided between the first optical waveguide 120*a* and the second optical waveguide 120*b*, a first resonant wavelength control element 122 configured to control a resonant wavelength of the first ring resonator 121, and a second resonant wavelength control element 124 configured to control a resonant wavelength of the second ring resonator 123. For example, the tunable laser light source 100 may be an on-chip type tunable laser in which all components are integrated on one substrate 101**.

The tunable laser light source 100 may further include a waveguide layer 102 disposed on the substrate 101. The first optical waveguide **120*a* and the second optical waveguide 120*b* may be formed by patterning the waveguide layer 102, and are arranged to face each other at a distance from each other in a first direction (i.e., an X direction) within the waveguide layer 102. In addition, each of the first optical waveguide 120*a* and the second optical waveguide 120*b*** may extend in a second direction (i.e., a Y direction) perpendicular to the first direction.

The first optical amplifier **110*a* and the second optical amplifier 110*b* may be semiconductor optical amplifiers (SOAs) integrated on the waveguide layer 102 using a semiconductor manufacturing process. The first optical amplifier 110*a* and the second optical amplifier 110*b* may amplify light and simultaneously generate light. For example, the first optical amplifier 110*a* is provided on the first optical waveguide 120*a*, and may be configured to generate light, provide light to the first optical waveguide 120*a*, and simultaneously amplify light traveling along the first optical waveguide 120*a*. In addition, the second optical amplifier 110*b* is provided on the second optical waveguide 120*b*, and may be configured to generate light, provide light to the second optical waveguide 120*b*, and simultaneously amplify light traveling along the second optical waveguide 120*b*. The first optical amplifier 110*a* on the first optical waveguide 120*a* and the second optical amplifier 110*b* on the second optical waveguide 120*b*** may be spaced apart from each other in the first direction and may extend in the second direction.

The first ring resonator 121 and the second ring resonator 123 may be patterned on the waveguide layer 102. The first ring resonator 121 and the second ring resonator 123 may be disposed between the first optical waveguide 120*a* and the second optical waveguide 120*b* in a first direction. The first optical amplifier 110*a* and the second optical amplifier 110*b* may be disposed between the first ring resonator 121 and the second ring resonator 123 in a second direction. For example, the first ring resonator 121 may be disposed between the first optical waveguide 120*a* and the second optical waveguide 120*b* in the first direction near a first end of the first optical amplifier 110*a* and a first end of the second optical amplifier 110*b* in the second direction. In addition, the second ring resonator 123 may be disposed between the first optical waveguide 120*a* and the second optical waveguide 120*b* in the first direction near a second end, which is an opposite side to the first end of the first optical amplifier 110*a* and a second end of the second optical amplifier 110*b* in the second direction. In FIG. 1, the tunable laser light source 100 is illustrated as having two ring resonators as an example, but is not limited thereto, and may include three or more ring resonators as needed. Hereinafter, for convenience, a case in which the tunable laser light source 100 has two ring resonators will be described, as an example.

The first ring resonator 121 and the second ring resonator 123 may not physically contact the first optical waveguide 120*a* and the second optical waveguide 120*b* but may be disposed to be optically coupled to each other. The shortest distance between the first optical waveguide 120*a* and the first ring resonator 121, the shortest distance between the first optical waveguide 120*a* and the second ring resonator 123, the shortest distance between the second optical waveguide 120*b* and the first ring resonator 121, and the shortest distance between the second optical waveguide 120*b* and the second ring resonator 123 may be less than or equal to about twice a width of the first and second optical waveguides 120*a* and 120*b*, for example, in a range from about 0.5 times to about 1 time. For example, the shortest distance between the first optical waveguide 120*a* and the first ring resonator 121, the shortest distance between the first optical waveguide 120*a* and the second ring resonator 123, the shortest distance between the second optical waveguide 120*b* and the first ring resonator 121, and the shortest distance between the second optical waveguide 120*b* and the second ring resonator 123 may be in a range from about 0.1 μm to about 1 μm, but are not limited thereto. Then, light traveling along the first optical waveguide 120*a* or the second optical waveguide 120*b* may be transmitted to the first ring resonator 121 or the second ring resonator 123, a part of light resonating in the first ring resonator 121 or the second ring resonator 123 may be transmitted to the first optical waveguide 120*a* or the second optical waveguide 120*b*.

The first ring resonator 121 and the second ring resonator 123 are closed-loop resonators having ring-shaped waveguides. The resonance wavelengths of light circulating in the ring-shaped waveguides may vary depending on diameters or a circumferential length of the ring-shaped waveguide. In other words, the resonance wavelengths of the first ring resonator 121 and the second ring resonator 123 may vary depending on the diameters or the circumferential length of the first ring resonator 121 and the second ring resonator 123. A diameter of the first ring resonator 121 and a diameter of the second ring resonator 123 may be the same or different. In other words, a resonant wavelength of the first ring resonator 121 and a resonant wavelength of the second ring resonator 123 may be the same or different.

In addition, the resonant wavelength of the first ring resonator 121 may be finely adjusted by the first resonant wavelength control element 122, and the resonant wavelength of the second ring resonator 123 may be finely adjusted by the second resonant wavelength control element 124. Each of the first resonant wavelength control element 122 and the second resonant wavelength control element 124 may be implemented as a thermo-optic resonant wavelength control element configured to change a refractive index of the first ring resonator 121 and the second ring resonator 123 by changing the temperature of the first ring resonator 121 and the second ring resonator 123, an electro-optic resonant wavelength control element configured to change the refractive index by applying an electric field to the first ring resonator 121 and the second ring resonator 123, and an actuator configured to apply mechanical stress to the first ring resonator 121 and the second ring resonator 123 to adjust the resonant wavelength by changing the geometry of the first ring resonator 121 and the second ring resonator 123. For example, the first and second resonant wavelength control elements 122 and 124 may change a phase of light traveling along the first and second ring resonators 121 and 123, respectively. Change in the phase of light may cause a change in an optical length of a closed-curve waveguide, leading to a change in the resonant wavelengths of the first and second ring resonators 121 and 123. For example, an increase in the phase delay of light results in an increase in the optical length of the closed-curve waveguide, causing the resonant wavelengths of the first and second ring resonators 121 and 123 to increase. Conversely, a decrease in the phase delay of light leads to a decrease in the optical length of the closed-curve waveguide, causing the resonant wavelengths of the first and second ring resonators 121 and 123 to decrease.

The first and second resonant wavelength control elements 122 and 124 may change the temperature of the first and second ring resonators 121 and 123 or change the concentration of carriers (e.g., electrons or holes). For example, the temperature change method changes the refractive index of the first and second ring resonators 121 and 123 by changing the temperature around the first and second ring resonators 121 and 123, and thus, may adjust the resonant wavelengths of the first and second ring resonators 121 and 123. In addition, the carrier concentration change method changes the refractive index of the first and second ring resonators 121 and 123 through a change of carrier concentration by placing a diode junction around a central region of the first and second ring resonators 121 and 123, and thus, may adjust the resonant wavelengths of the first and second ring resonators 121 and 123.

Although one first or second resonant wavelength control element 122 or 124 may be disposed for each of the first and second ring resonators 121 and 123, a plurality of first and second resonant wavelength control elements 122 and 124 may be in place. In the embodiment shown in FIG. 1, four first and second resonant wavelength control elements 122 and 124 are disposed for each of the first and second ring resonators 121 and 123, but the number of the first and second resonant wavelength control elements 122 and 124 is not limited thereto.

Also, the first and second resonant wavelength control elements 122 and 124 may be electrically controlled by a controller not shown. The controller may adjust the resonance wavelengths of the first and second ring resonators 121 and 123 through controlling the first and second resonant wavelength control elements 122 and 124. Light that is to be output from the tunable laser light source 100 may be adjusted to have a wavelength that satisfies both a resonance condition of the first ring resonator 121 and a resonance condition of the second ring resonator 123. Accordingly, a wavelength of light output from the tunable laser light source 100 may be adjusted by controlling the first and second resonant wavelength control elements 122 and 124.

According to an embodiment, the tunable laser light source 100 may further include a thermal isolation structure 130 that suppresses or reduces thermal coupling between the first optical amplifier 110*a* and the second optical amplifier 110*b*. Referring to FIG. 1, the thermal isolation structure 130 may be disposed between the first optical amplifier 110*a* and the second optical amplifier 110*b* in the first direction. Also, the thermal isolation structure 130 may extend in the second direction. A length of the thermal isolation structure 130 in the second direction may be greater than a length of the first optical amplifier 110*a* in the second direction and a length of the second optical amplifier 110*b* in the second direction. For example, in the second direction, a first end of the thermal isolation structure 130 protrudes beyond the first end of the first optical amplifier 110*a* and the first end of the second optical amplifier 110*b*, and a second end opposite to the first end of the thermal isolation structure 130 may protrude beyond the second end of the first optical amplifier 110*a* and the second end of the second optical amplifier 110*b*. Then, the first resonator 121 may be disposed to face the first end of the thermal isolation structure 130 in the second direction, and the second resonator 123 may be disposed to face second end of the thermal isolation structure 130 in the second direction.

Accordingly, the first end of the thermal isolation structure 130 may be closer to the first ring resonator 121 than the first end of the first optical amplifier 110*a* and the first end of the second optical amplifier 110*b*. Also, the second end of the thermal isolation structure 130 may be closer to the second ring resonator 123 than the second end of the first optical amplifier 110*a* and the second end of the second optical amplifier 110*b*. In other words, the thermal isolation structure 130 is positioned such that a distance between the first end of the thermal isolation structure 130 and the first ring resonator 121 in the second direction may be less than a distance between the first end of the first optical amplifier 110*a* and the first ring resonator 121, as well as a distance between the first end of the second optical amplifier 110*b* and the first ring resonator 121. Similarly, and a distance between the second end of the thermal isolation structure 130 and the second ring resonator 123 in the second direction may be less than a distance between the second end of the first optical amplifier 110*a* and the second ring resonator 123, as well as a distance between the second end of the second optical amplifier 110*b* and the second ring resonator 123.

The thermal isolation structure 130 may include a material having a thermal conductivity less than that of a material of the first and second optical amplifiers 110*a* and 110*b*. Also, the thermal isolation structure 130 may include a material having a thermal conductivity less than that of a material of the first and second optical waveguides 120*a* and 120*b*, that is, a material of the waveguide layer 102. This material selection helps reduce or suppress the thermal coupling between the first optical amplifier 110*a* and the second optical amplifier 110*b*, thereby enhancing the stability and reliability of the tunable laser light source 100. In other words, the thermal isolation structure 130 may prevent or mitigate the transfer of heat generated during operation of the first optical amplifier 110*a* to the second optical amplifier 110*b* and may prevent or mitigate the transfer of heat generated during operation of the second optical amplifier 110*b* to the first optical amplifier 110*a*. In addition, the thermal isolation structure 130 may prevent or mitigate the transfer of heat generated during operation of the first and second resonant wavelength control elements 122 and 124 to the first and second optical amplifiers 110*a* and 110*b*.

For example, the thermal isolation structure 130 may be formed by etching away a portion of the waveguide layer 102 between the first optical amplifier 110*a* and the second optical amplifier 110*b*, which exposes an upper surface of the substrate 101 under the waveguide layer 102. The thermal isolation structure 130 may be created as a result of the portion of the waveguide layer 102 being removed.

Figure 2:
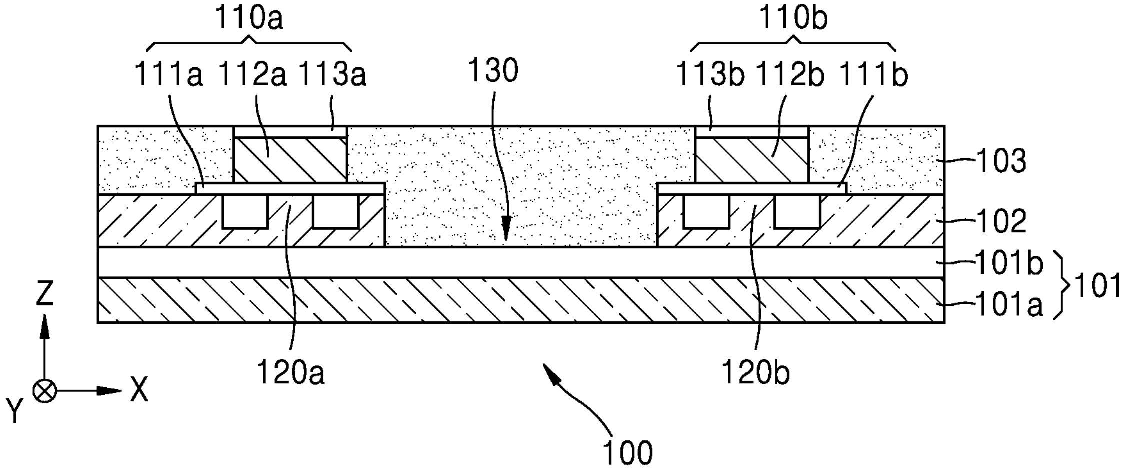
FIG. 2 is a diagram showing a schematic cross-sectional view of a structure of the tunable laser light source shown in FIG. 1.

FIG. 2 is a diagram showing a schematic cross-sectional structure of the tunable laser light source 100 shown in FIG. 1. In particular, FIG. 2 is a cross-sectional view taken along line A-A' of the tunable laser light source 100 shown in FIG. 1. Referring to FIG. 2, the tunable laser light source 100 may include the substrate 101, the waveguide layer 102 on the substrate 101, and a cladding layer 103 on the waveguide layer 102. In FIG. 1, the cladding layer 103 is not shown for convenience.

The substrate 101 may include a semiconductor layer 101*a* and a dielectric layer 101*b* disposed on the semiconductor layer 101*a*. The semiconductor layer 101*a* may include, for example, a semiconductor material, such as silicon (Si), a Group III-V compound semiconductor, a Group II-VI compound semiconductor, germanium (Ge), etc., but is not necessarily limited thereto. In addition, the dielectric layer 101*b* may include a dielectric material, such as, silicon oxide ($SiO_2$), silicon nitride (SiN), or aluminum oxide ($Al_2O_3$), but is not necessarily limited thereto. The dielectric layer 101*b* may be disposed over an entire area of an upper surface of the semiconductor layer 101*a*. For example, the substrate 101 may include a single silicon on insulator (SOI) substrate. Although, in FIG. 1, it is shown that the substrate 101 includes two layers, but is not limited thereto and may include only the dielectric layer 101*b*. For example, after manufacturing the tunable laser light source 100, the lower semiconductor layer 101*a* may be removed if necessary.

The waveguide layer 102 may be disposed on an upper surface of the substrate 101, for example, on the dielectric layer 101*b*. In other words, the dielectric layer 101*b* may be disposed on an entire region between the semiconductor layer 101*a* and the waveguide layer 102. In the waveguide layer 102, the first and second optical waveguides 120*a* and 120*b* formed by patterning a partial region of an upper surface of the waveguide layer 102 are disposed. The first and second optical waveguides 120*a* and 120*b* may extend in the second direction (i.e., the Y direction) in the waveguide layer 102. The dielectric layer 101*b* under the first and second optical waveguides 120*a* and 120*b* may act as a lower cladding layer for confining light within the first and second optical waveguides 120*a* and 120*b*. To this end, the waveguide layer 102 may include a material having a greater refractive index than that of the dielectric layer 101*b*. For example, the waveguide layer 102 or the first and second optical waveguides 120*a* and 120*b* may include a semiconductor material, such as silicon (Si), a Group III-V compound semiconductor, a Group II-VI compound semiconductor, germanium (Ge), etc., but is not necessarily limited thereto. In FIG. 2, as an example, it is depicted that the first and second optical waveguides 120*a* and 120*b* are rib-type waveguides having one vertical protrusion but are not necessarily limited thereto. For example, the first and second optical waveguides 120*a* and 120*b* may be rib-type waveguides having a plurality of vertical protrusions or may be channel waveguides without protrusions.

The first and second optical amplifiers 110*a* and 110*b* may be respectively disposed on the first and second optical waveguides 120*a* and 120*b*. The first optical amplifier 110*a* may include, for example, a first lower contact layer 111*a* disposed on the first optical waveguide 120*a*, a first gain material layer 112*a* disposed on the first lower contact layer 111*a*, and a first upper contact layer 113*a* disposed on the first gain material layer 112*a*. In addition, the second optical amplifier 110*b* may include, for example, a second lower contact layer 111*b* disposed on the second optical waveguide 120*b*, a second gain material layer 112*b* disposed on the second lower contact layer 111*b*, and a second upper contact layer 113*b* disposed on the second gain material layer 112*b*.

The first and second lower contact layers 111*a* and 111*b*, the first and second gain material layers 112*a* and 112*b*, and the first and second upper contact layers 113*a* and 113*b* may include a semiconductor material having a direct bandgap. For example, the first and second lower contact layers 111*a* and 111*b*, the first and second gain material layers 112*a* and 112*b*, and the first and second upper contact layers 113*a* and 113*b* may include a semiconductor material, such as a Group III-V compound semiconductor, a Group II-VI compound semiconductor, etc.

The first and second lower contact layers 111*a* and 111*b* and the first and second upper contact layers 113*a* and 113*b* form an ohmic contact for applying current to the first and second gain material layers 112*a* and 112*b*. To this end, the first and second lower contact layers 111*a* and 111*b* and the first and second upper contact layers 113*a* and 113*b* may be highly doped with electrically opposite conductivity types. For example, the first and second lower contact layers 111*a* and 111*b* may be doped with n-type and the first and second upper contact layers 113*a* and 113*b* may be doped with p-type, or the first and second upper contact layers 113*a* and 113*b* may be doped with p-type and the first and second upper contact layers 113*a* and 113*b* may be doped with n-type.

The first and second gain material layers 112*a* and 112*b* may generate light and amplify the light according to an applied current. For example, the first and second gain material layers 112*a* and 112*b* may include a multiple quantum well (MQW) structure having a plurality of barriers and a plurality of quantum wells alternately stacked in a vertical direction. The wavelength band and bandwidth of light generated from the first and second gain material layers 112*a* and 112*b* may vary depending on a band gap of a semiconductor material that forms the first and second gain material layers 112*a* and 112*b* and a thickness of the quantum well.

The cladding layer 103 may be disposed to cover the first and second optical waveguides 120*a* and 120*b* and the first and second optical amplifiers 110*a* and 110*b*. For subsequent electrical connection and thermal management, upper surfaces of the first and second upper contact layers 113*a* and 113*b* may pass through the cladding layer 103 and be exposed to outside. The cladding layer 103 may act as an upper cladding layer for confining light within the first and second optical waveguides 120*a* and 120*b*. To this end, the cladding layer 103 may include a material having a refractive index lower than that of the waveguide layer 102. For example, the cladding layer 103 may include a dielectric material, such as silicon oxide ($SiO_2$), silicon nitride (SiN), or aluminum oxide ($Al_2O_3$), but is not necessarily limited thereto.

The thermal isolation structure 130 may be formed by removing a partial region of the waveguide layer 102 between the first optical amplifier 110*a* and the second optical amplifier 110*b* through etching. As shown in FIG. 2, the waveguide layer 102 may be separated by being disconnected in the first direction (i.e., the X direction) by the thermal isolation structure 130 between the first optical amplifier 110*a* and the second optical amplifier 110*b* and between the first optical waveguide 120*a* and the second optical waveguide 120*b*. Therefore, the upper surface of the substrate 101, for example, an upper surface of the dielectric layer 101*b* may be exposed outside the waveguide layer 102 in the thermal isolation structure 130 between the first optical amplifier 110*a* and the second optical amplifier 110*b* and between the first optical waveguide 120*a* and the second optical waveguide 120*b*. In addition, a portion from which the waveguide layer 102 is removed may be filled with the cladding layer 103 between the first optical amplifier 110*a* and the second optical amplifier 110*b* and between the first optical waveguide 120*a* and the second optical waveguide 120*b*. Then, the substrate 101, for example, the dielectric layer 101*b* may directly contact the cladding layer 103 between the first optical amplifier 110*a* and the second optical amplifier 110*b* and between the first optical waveguide 120*a* and the second optical waveguide 120*b*. In other words, in the thermal isolation structure 130, the substrate 101, for example, the dielectric layer 101*b* may directly contact the cladding layer 103 each other. Therefore, the thermal isolation structure 130 may be a region filled with the cladding layer 103 between the first optical amplifier 110*a* and the second optical amplifier 110*b* and between the first optical waveguide 120*a* and the second optical waveguide 120*b*.

The dielectric material of the cladding layer 103 may have lower thermal conductivity than the semiconductor material of the waveguide layer 102. In other words, the thermal conductivity of the thermal isolation structure 130 may be less than that of the waveguide layer 102. For example, the thermal conductivity of the dielectric material of the cladding layer 103 may be ¼ or less of the thermal conductivity of the semiconductor material of the waveguide layer 102. Therefore, the portion where the waveguide layer 102 is removed and filled with the cladding layer 103 between the first optical amplifier 110*a* and the second optical amplifier 110*b* and between the first optical waveguide 120*a* and the second optical waveguide 120*b* may be the thermal isolation structure 130 that may prevent or mitigate thermal coupling between the first optical amplifier 110*a* and the second optical amplifier 110*b*.

Figure 3:
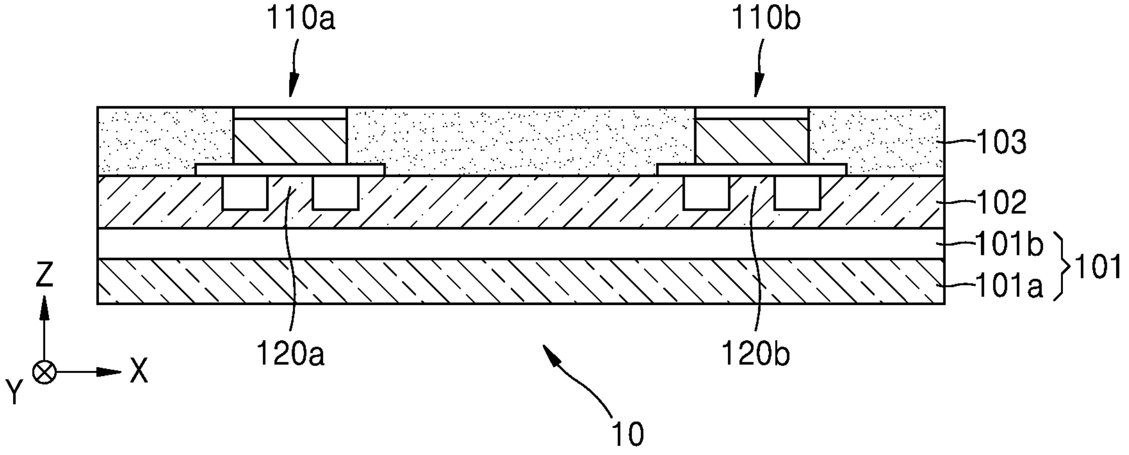
FIG. 3 is a schematic cross-sectional view of a structure of a tunable laser light source according to a comparative example.

FIG. 3 is a schematic cross-sectional structure of a tunable laser light source 10 according to a comparative example. In the tunable laser light source 10 according to the comparative example, the waveguide layer 102 may be continuously connected between the first optical amplifier 110*a* and the second optical amplifier 110*b* without any disconnection. Consequently, heat generated in the first optical amplifier 110*a* may be easily transmitted to the second optical amplifier 110*b* through a material, such as silicon (Si) of the waveguide layer 102, or heat generated in the second optical amplifier 110*b* may be easily transmitted to the first optical amplifier 110*a* through the material of the waveguide layer 102.

Figure 4:
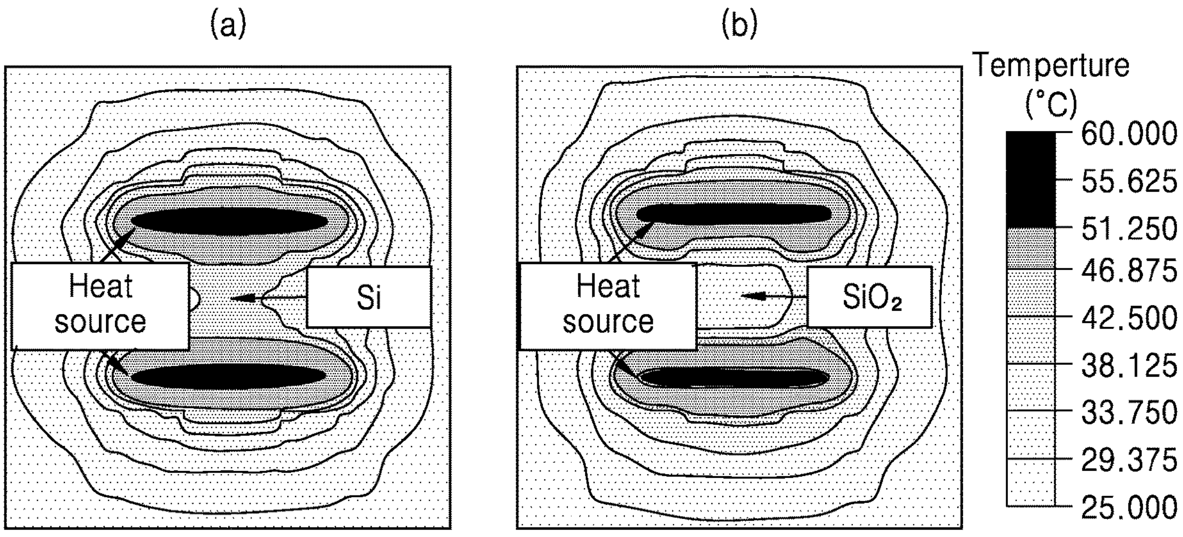
FIG. 4 is a diagram illustrating heat distribution in a tunable laser light source according to an embodiment and a tunable laser light source according to a comparative example.

FIG. 4 is a diagram illustrating heat distribution in the tunable laser light source 100 according to an embodiment and the tunable laser light source 10 according to a comparative example. In FIG. 4, image (a) shows a heat distribution when a silicon waveguide layer is continuously connected between two heat sources corresponding to the first and second optical amplifiers 110*a* and 110*b*, and image (b) shows a heat distribution when the silicon waveguide layer is removed, and the removed portion between the two heat sources is filled with $SiO_2$. As illustrated in FIG. 4, the thermal coupling between the two heat sources may be reduced by removing the silicon waveguide layer and filling the gap between the two heat sources with a material having a less thermal conductivity than silicon.

Figure 5:
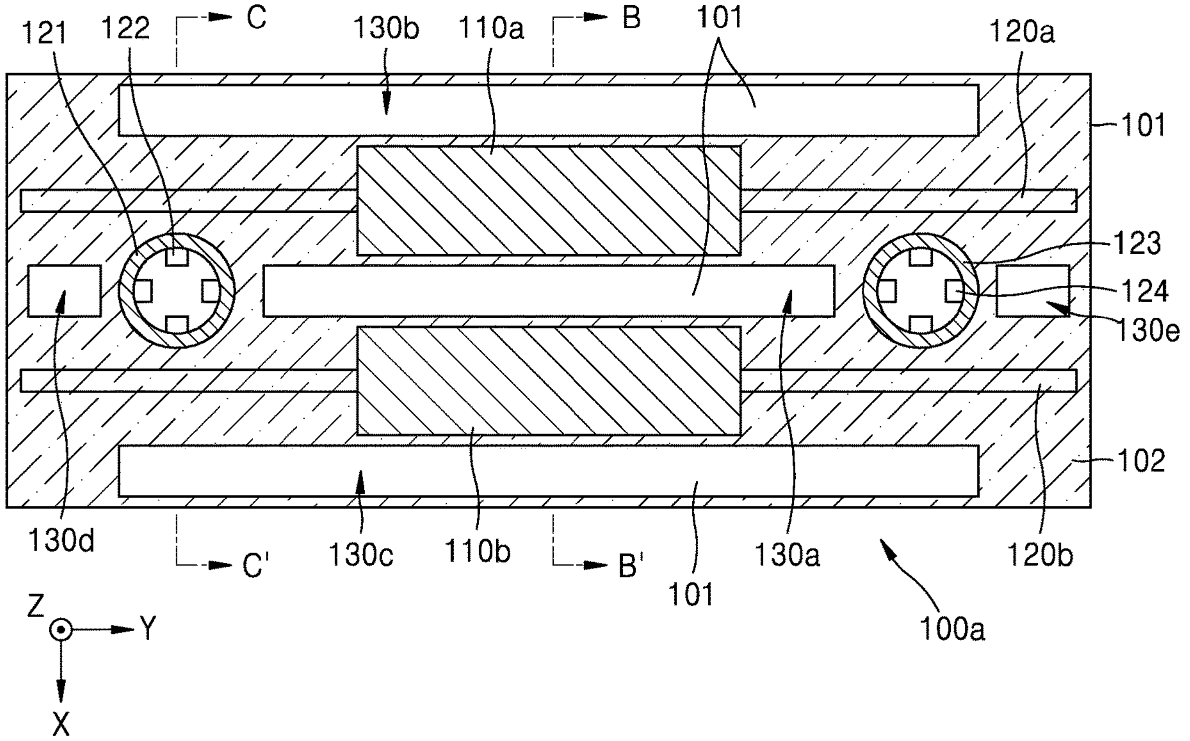
FIG. 5 is a schematic diagram showing a structure of a tunable laser light source according to another embodiment.

FIG. 5 is a schematic diagram showing a structure of a tunable laser light source 100*a* according to another embodiment. The tunable laser light source 100*a* may further include thermal isolation structures that prevent or reduce thermal coupling between the first optical amplifier 110*a*, the second optical amplifier 110*b*, and other components. For example, referring to FIG. 5, the tunable laser light source 100*a* may include a first thermal isolation structure 130*a* disposed between a first side of the first optical amplifier 110*a* and a first side of the second optical amplifier 110*b* in the first direction, a second thermal isolation structure 130*b* disposed to face a vicinity of a second side of the first optical amplifier 110*a* opposite to the first side of the first optical amplifier 110*a* in the first direction, a third thermal isolation structure 130*c* disposed to face a vicinity of a second side of the second optical amplifier 110*b* opposite to the first side of the second optical amplifier 110*b* in the first direction, a fourth thermal isolation structure 130*d* disposed to face a vicinity of a side surface of the first ring resonator 121 in the second direction, and a fifth thermal isolation structure 130*e* disposed to face a vicinity of a side surface of the second ring resonator 123 in the second direction.

The first thermal isolation structure 130*a* may have the same structure or substantially the same structure as the thermal isolation structure 130 described with reference to FIG. 1. The first thermal isolation structure 130*a*, the second thermal isolation structure 130*b*, and the third thermal isolation structure 130*c* may be spaced apart from each other and parallel to each other in the first direction, and may extend in the second direction. The first thermal isolation structure 130*a* and the second thermal isolation structure 130*b* are disposed to face both sides of the first optical amplifier 110*a* in the first direction, and the first thermal isolation structure 130*a* and the third thermal isolation structure 130*c* are disposed to face both sides of the second optical amplifier 110*b* in the first direction. In other words, the first optical amplifier 110*a* is disposed between the first thermal isolation structure 130*a* and the second thermal isolation structure 130*b*, and the second optical amplifier 110*b* is disposed between the first thermal isolation structure 130*a* and the third thermal isolation structure 130*c*. A length of the second thermal isolation structure 130*b* in the second direction and a length of the third thermal isolation structure 130*c* in the second direction may be greater than a length of the first thermal isolation structure 130*a* in the second direction. For example, the second thermal isolation structure 130*b* and the third thermal isolation structure 130*c* may extend in the first direction to face side surfaces of the first ring resonator 121 and the second ring resonator 123. The length of the second thermal isolation structure 130*b* in the second direction and the length of the third thermal isolation structure 130*c* in the second direction may be equal to each other.

The fourth thermal isolation structure 130*d* and the fifth thermal isolation structure 130*e* may be disposed between the first optical waveguide 120*a* and the second optical waveguide 120*b* in the first direction. Also, the fourth thermal isolation structure 130*d* and the fifth thermal isolation structure 130*e* may be positioned on the same line as the first thermal isolation structure 130*a* in the second direction. For example, the fourth thermal isolation structure 130*d* may be disposed to face the first end of the first thermal isolation structure 130*a* with the first ring resonator 121 therebetween in the second direction. The fifth thermal isolation structure 130*e* may be disposed to face the second end of the first thermal isolation structure 130*a* with the second ring resonator 123 therebetween in the second direction. In other words, the first ring resonator 121 may be disposed between the first thermal isolation structure 130*a* and the fourth thermal isolation structure 130*d* in the second direction. Also, the second ring resonator 123 may be disposed between the first thermal isolation structure 130*a* and the fifth thermal isolation structure 130*e* in the second direction.

Accordingly, each of the components of the tunable laser light source 100*a* is surrounded by at least two of the first to fifth thermal isolation structures 130*a*, 130*b*, 130*c*, 130*d*, and 130*e*. The first to fifth thermal isolation structures 130*a*, 130*b*, 130*c*, 130*d*, and 130*e* may thermally isolate each of the components of the tunable laser light source 100*a*. In other words, the first to fifth thermal isolation structures 130*a*, 130*b*, 130*c*, 130*d*, and 130*e* may prevent or mitigate the thermal coupling between the first optical amplifier 110*a*, the second optical amplifier 110*b*, the first ring resonator 121, and the second ring resonator 123.

Figure 6:
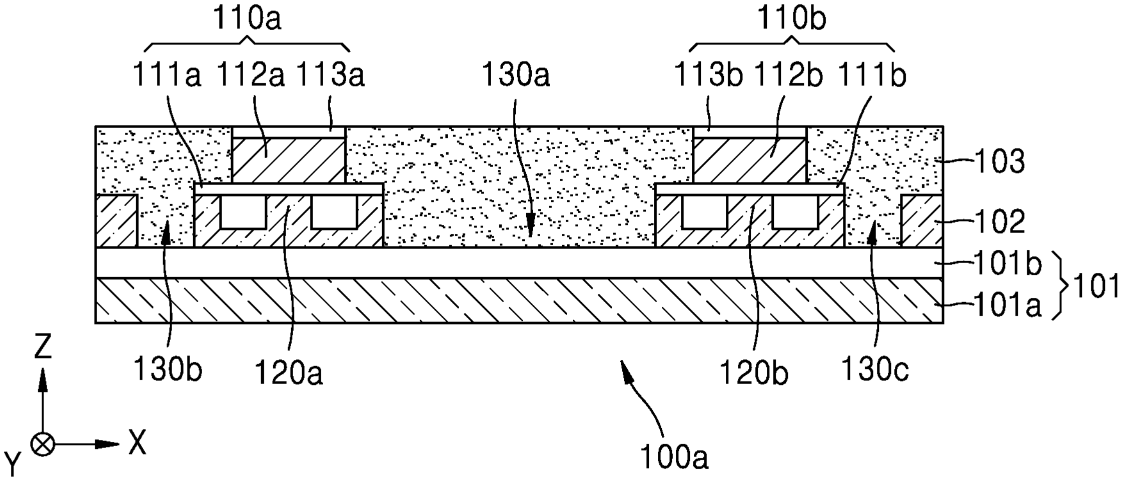
FIG. 6 is a schematic cross-sectional view of a structure of the tunable laser light source shown in FIG. 5.

FIG. 6 is a schematic cross-sectional structure of the tunable laser light source 100*a* shown in FIG. 5. In particular, FIG. 6 is a cross-sectional view taken along line B-B' of the tunable laser light source 100*a* shown in FIG. 5. Referring to FIG. 6, the first to third thermal isolation structures 130*a*, 130*b*, and 130*c* may be formed by etching away portions of the waveguide layer 102 on both sides of the first and second optical amplifiers 110*a* and 110*b* in the first direction. Accordingly, the waveguide layer 102 may be divided into multiple segments by the first to third thermal isolation structures 130*a*, 130*b*, and 130*c*, which cut through the waveguide layer 102 in the first direction (i.e., the X direction). In the first to third thermal isolation structures 130*a*, 130*b*, and 130*c*, the substrate 101, for example, the dielectric layer 101*b* may directly contact the cladding layer 103, and portions of the waveguide layer 102 removed and filled with the cladding layer 103 may the first to third thermal isolation structures 130*a*, 130*b*, and 130*c*. Meanwhile, configurations that are not described in FIG. 6 are the same as those described with reference to FIG. 2, and thus, detailed descriptions thereof are omitted.

Figure 7:
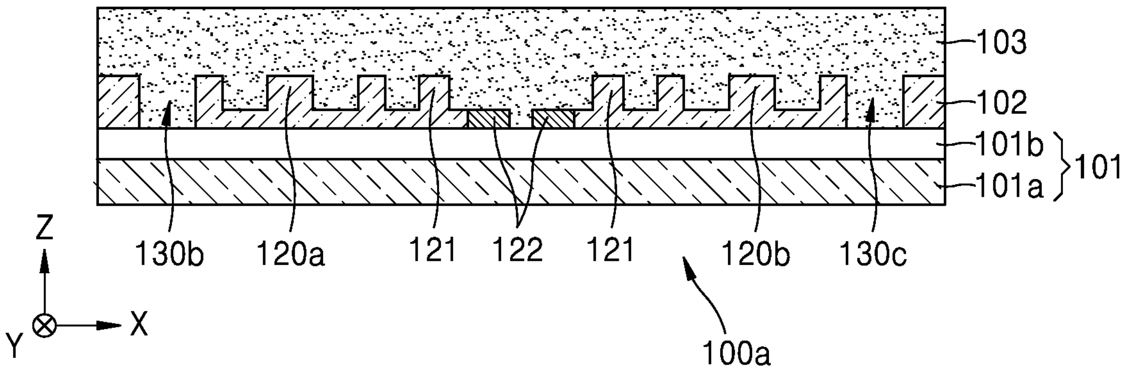
FIG. 7 is a schematic diagram showing a cross-sectional view of a structure of a first ring resonator of the tunable laser light source shown in FIG. 5.

FIG. 7 is a schematic diagram showing a cross-sectional structure of the first ring resonator 121 of the tunable laser light source 100*a* shown in FIG. 5. In particular, FIG. 7 is a cross-sectional view taken along line C-C' of the tunable laser light source 100*a* shown in FIG. 5. Referring to FIG. 7, the waveguide layer 102 may include a first ring resonator 121 disposed between the first optical waveguide 120*a* and the second optical waveguide 120*b* in the first direction. The first ring resonator 121 may be formed by etching a partial region of an upper surface of the waveguide layer 102. For example, the first ring resonator 121 may be formed by patterning the waveguide layer 102 to have a ring-shaped vertical protrusion. In addition, at least one first resonant wavelength control element 122 may be disposed in contact with the ring-shaped waveguide of the first ring resonator 121. Although two first resonant wavelength control elements 122 are illustrated in FIG. 7 as an example, it is not limited thereto. Also, although not shown in FIG. 7, a second ring resonator 123 may further be disposed between the first optical waveguide 120*a* and the second optical waveguide 120*b* in the first direction in the waveguide layer 102.

In addition, the second thermal isolation structure 130*b* may be disposed to face a side surface of the first ring resonator 121 with the first optical waveguide 120*a* therebetween in the first direction, and the third thermal isolation structure 130*c* may be disposed to face the opposite side of the first ring resonator 121 with the second optical waveguide 120*b* therebetween in the first direction. As described above, the second and third thermal isolation structures 130*a* and 130*b* are formed by etching portions of the waveguide layer 102 to expose the upper surface of the substrate 101, for example, the upper surface of the dielectric layer 101*b*.

As described above, the thermal isolation structures in the tunable laser light sources 100 and 100*a* may provide thermal isolation to components of the tunable laser light sources 100 and 100*a*. Accordingly, it is possible to thermally optimized design and thermal management for each of the components of the tunable laser light sources 100 and 100*a* to fit the unique characteristics of the components, if necessary.

Figure 8:
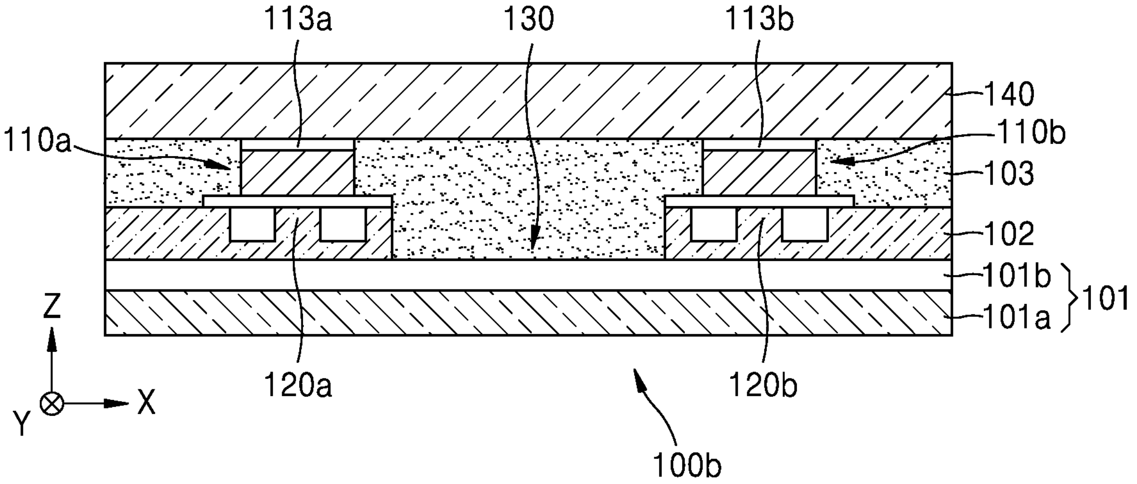
FIG. 8 is a schematic cross-sectional structure of a tunable laser light source according to another embodiment.

FIG. 8 is a schematic cross-sectional structure of a tunable laser light source 100*b* according to another embodiment. Referring to FIG. 8, the tunable laser light source 100*b* according to an embodiment may include a thermal management device 140 disposed on an upper surface of a cladding layer 103. In this case, the thermal management device 140 may contact the first upper contact layer 113*a* of the first optical amplifier 110*a* and the second upper contact layer 113*b* of the second optical amplifier 110*b*. Heat generated from the first optical amplifier 110*a* and the second optical amplifier 110*b* may be dissipated to the outside of the tunable laser light source 100*b* through the thermal management device 140. The thermal management device 140 may include one material having a relatively high thermal conductivity, but is not limited thereto. The thermal management device 140 may include, for example, a thermoelectric cooler (TEC). Meanwhile, in FIG. 8, although the tunable laser light source 100*b* is illustrated as including one thermal isolation structure 130, it is not limited thereto, and the plurality of thermal isolation structures 130*a*, 130*b*, 130*c*, 130*d*, 130*e* may be included.

Figure 9:
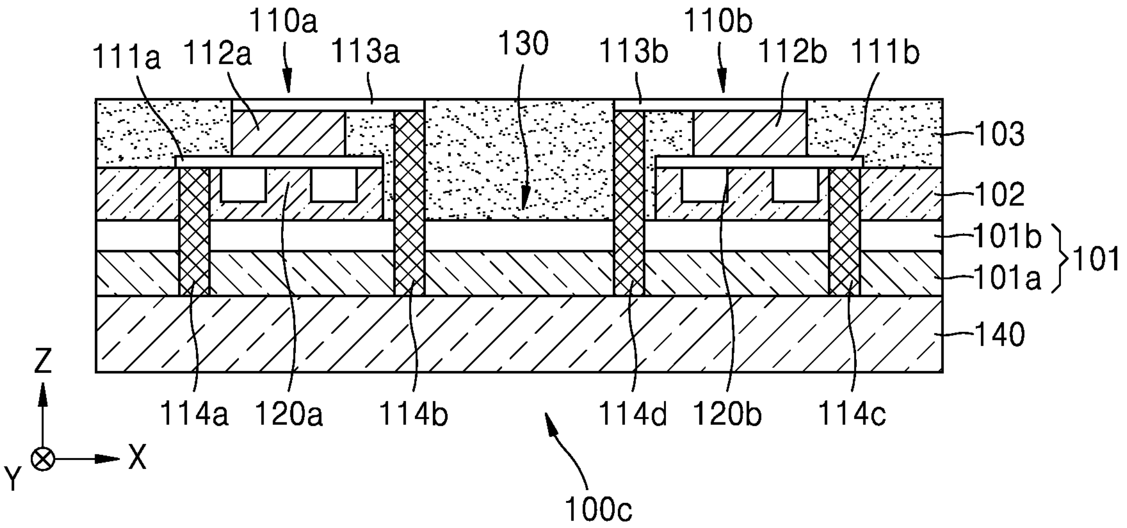
FIG. 9 is a schematic cross-sectional view of a structure of a tunable laser light source according to another embodiment.

FIG. 9 is a schematic cross-sectional structure of a tunable laser light source 100*c* according to another embodiment. Referring to FIG. 9, the tunable laser light source 100*c* according to another embodiment may include a thermal management device 140 disposed on a lower surface of a substrate 101. In addition, the tunable laser light source 100*c* may further include a first thermal conductive plug 114*a* connected between a first lower contact layer 111*a* of the first optical amplifier 110*a* and the thermal management device 140, a second thermal conductive plug 114*b* connected between a first upper contact layer 113*a* of the first optical amplifier 110*a* and the thermal management device 140, a third thermal conductive plug 114*c* connected between a second lower contact layer 111*b* of the second optical amplifier 110*b* and the thermal management device 140, and a fourth thermal conductive plug 114*d* connected between a second upper contact layer 113*b* of the second optical amplifier 110*b* and the thermal management device 140.

The first thermal conductive plug 114*a* may pass through the substrate 101 and the waveguide layer 102 and extend in a third direction (i.e., a Z direction) perpendicular to the first and second directions between the thermal management device 140 and the first lower contact layer 111*a*. In addition, the third thermally conductive plug 114*c* may pass through the substrate 101 and the waveguide layer 102 and extend in the third direction between the thermal management device 140 and the second lower contact layer 111*b*. The second thermal conductive plug 114*b* may pass through the substrate 101, the waveguide layer 102, and the cladding layer 103 and extend in the third direction between the thermal management device 140 and the first upper contact layer 113*a*. The fourth thermally conductive plug 114*d* may pass through the substrate 101, the waveguide layer 102, and the cladding layer 103 and extend in the third direction between the thermal management device 140 and the second upper contact layer 113*b*. The first upper contact layer 113*a* may protrude beyond the first optical waveguide 120*a* in a first direction, extend toward a thermal isolation structure 130, and contact the second thermal conductive plug 114*b*. The second upper contact layer 113*b* may protrude beyond the second optical waveguide 120*b* in the first direction and extend toward the thermal isolation structure 130 to contact the fourth thermal conductive plug 114*d*.

In the embodiment shown in FIG. 9, the thermal management device 140 may further include a driving circuit therein. In this case, the first to fourth thermal conductive plugs 114*a*, 114*b*, 114*c*, and 114*d* may include an electrically conductive metal material. Then, the thermal management device 140 may perform both thermal management control and driving control for the tunable laser light source 100*c*. The thermal management device 140, for example, may apply a voltage to the first to fourth thermal conductive plugs 114*a*, 114*b*, 114*c*, and 114*d* according to operating states of the first and second optical amplifiers 110*a* and 110*b*, and, at the same time, may optimally operate the first and second optical amplifiers 110*a* and 110*b* by individually cooling the first to fourth thermal conductive plugs 114*a*, 114*b*, 114*c*, and 114*d*.

Figure 10:
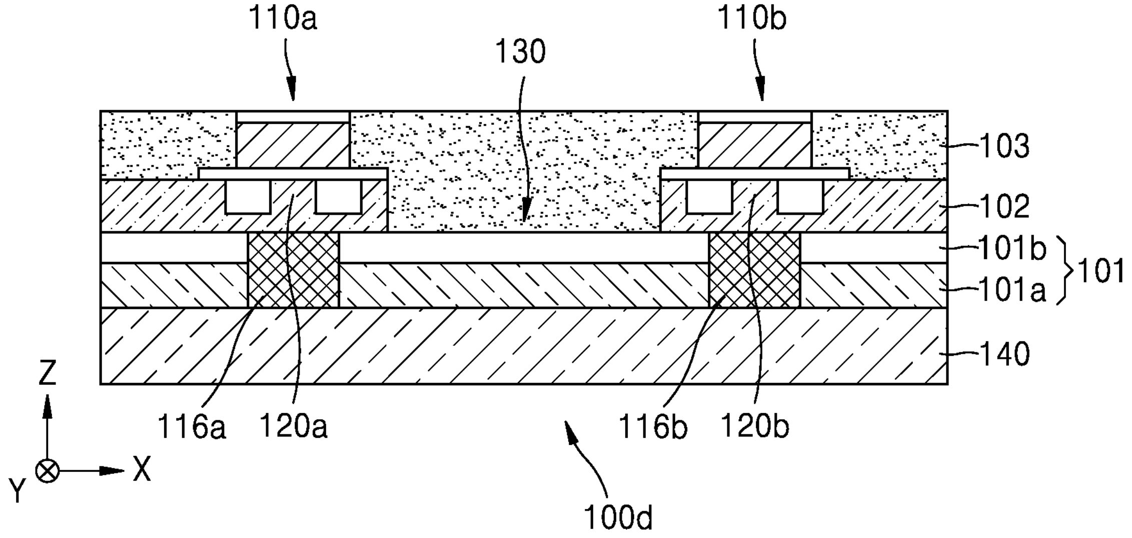
FIG. 10 is a schematic cross-sectional view of a structure of a tunable laser light source according to another embodiment.

FIG. 10 is a schematic cross-sectional structure of a tunable laser light source 100*d* according to another embodiment. Referring to FIG. 10, the tunable laser light source 100*d* according to another embodiment may include a thermal management device 140 disposed on a lower surface of a substrate 101. In addition, the tunable laser light source 100*d* may further include a first thermal conductive member 116*a* that transfers heat of the first optical waveguide 120*a* to the thermal management device 140 and a second thermal conductive member 116*b* that transfers heat of the second optical waveguide 120*b* to the thermal management device 140. The first thermal conductive member 116*a* may extend between the thermal management device 140 and the first optical waveguide 120*a*, and pass through the substrate 101 in the third direction. The second thermal conductive member 116*b* may extend between the thermal management device 140 and the second optical waveguide 120*b*, and pass through the substrate 101 in the third direction. The first and second thermal conductive members 116*a* and 116*b* shown in FIG. 10 may also be applied to the tunable laser light source 100*c* shown in FIG. 9.

Figure 11:
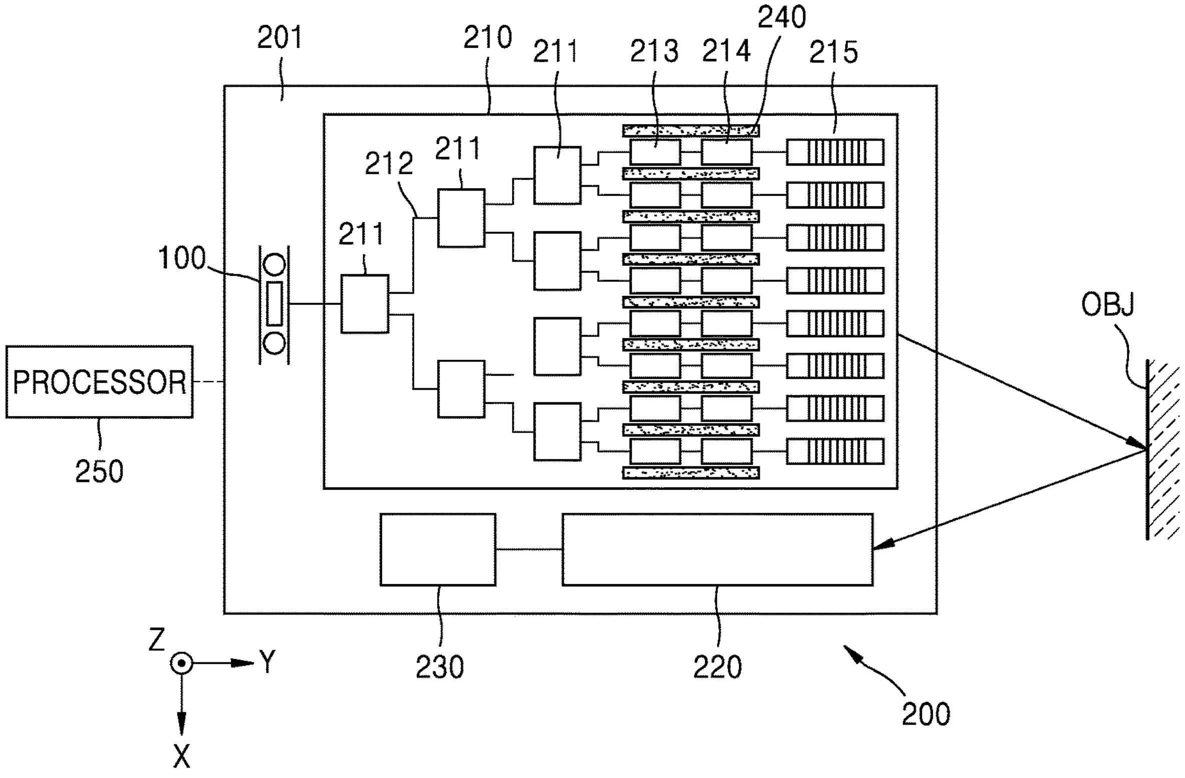
FIG. 11 is a schematic block diagram showing a configuration of a LIDAR apparatus according to an embodiment.

The tunable laser light sources described above may be applied to various devices requiring continuous wavelength change within a predetermined wavelength range. For example, the tunable laser light source described above may be applied to a LIDAR apparatus. FIG. 11 is a schematic block diagram showing a configuration of a LiDAR apparatus 200 according to an embodiment. Referring to FIG. 11, the LiDAR apparatus 200 according to an embodiment may include a tunable laser light source 100 configured to generate light, an optical transmitter 210 configured to emit light generated from the tunable laser light source 100 to outside, an optical receiver 220 configured to receive light from the outside, an optical detector 230 configured to detect light received by the optical receiver 220, and a processor

250 configured to control an operation of the LIDAR apparatus 200. Although the tunable laser light source 100 is illustrated in FIG. 11 as an example, the LiDAR apparatus 200 may include the tunable laser light sources 100*a*, 100*b*, 100*c*, and 100*d* according to other embodiments.

The optical transmitter 210 may be implemented based on an optical phased array (OPA) technology. For example, the optical transmitter 210 may include a plurality of light splitters 211, a plurality of optical amplifiers 213, a plurality of optical modulators 214, a plurality of grating antennas 215, and a plurality of optical waveguides 212. Light emitted from the tunable laser light source 100 may travel in a second direction (i.e., Y direction) through the plurality of optical waveguides 212. The plurality of light splitters 211 may be arranged so that light is split in the first direction (i.e., the X direction) while traveling in the second direction. The plurality of optical amplifiers 213 may be arranged to be separated from each other in the first direction. The plurality of optical modulators 214 may be disposed adjacent to corresponding optical amplifiers among the plurality of optical amplifiers 213 in the second direction and may be spaced apart from each other in the first direction. In addition, the plurality of grating antennas 215 may be disposed adjacent to corresponding optical modulators among the plurality of optical modulators 214 in the second direction and spaced apart from each other in the first direction with an interval.

The plurality of light splitters 211 may divide one light traveling along the optical waveguide 212 into several pieces of light. To this end, one optical waveguide 212 may be connected to an input end of each of the plurality of light splitters 211 and a plurality of optical waveguides 212 may be connected to an output end of each of the plurality of light splitters 211. In FIG. 11, as an example, a plurality of light splitters 211 dividing one light into two pieces of light are shown in FIG. 11. The plurality of light splitters 211 may be arranged, for example, in a binary tree structure. Light generated from the tunable laser light source 100 may be divided into a plurality of pieces of light by the plurality of light splitters 211 arranged in a binary tree structure. The plurality of divided pieces of light respectively travel along the plurality of optical waveguides 212. Although it is shown in FIG. 11 that the light generated from the tunable laser light source 100 is divided into 8 pieces of light, this is a simple example and is not necessarily limited thereto.

The light that is divided by the plurality of light splitters in the binary tree structure may be amplified by the plurality of optical amplifiers 213 as the light travels along the plurality of optical waveguides 212. The amplified light may then be phase-modulated by the plurality of optical modulators 214. Each of the plurality of optical modulators 214 may independently modulate a phase of light under the control of the processor 250. In FIG. 11, although the optical amplifier 213 is illustrated as being disposed in front of the optical modulator 214 in an optical path, it is not necessarily limited thereto and the positions of the optical amplifier 213 and the optical modulator 214 may be interchanged. In other words, light may first be phase modulated and then amplified.

Light may be emitted to the outside of the LIDAR apparatus 200 through the plurality of grating antennas 215. Each of the plurality of grating antennas 215 may include a plurality of grating patterns for emitting light to the outside. A direction in which light is emitted may be determined according to phases and wavelengths of light provided to the plurality of grating antennas 215. For example, an emission direction of light may be adjusted in the first direction or an azimuth direction according to phases of light provided to the plurality of grating antennas 215. In addition, the emission direction of light may be adjusted in the third direction (i.e., the Z direction) or an elevation angle direction according to a wavelength of light provided to the plurality of grating antennas 215.

The processor 250 may control the tunable laser light source 100 to adjust the wavelength of light provided to the optical transmitter 210 or the plurality of grating antennas 215. Also, the processor 250 may control phases of light provided to the plurality of grating antennas 215 by controlling the plurality of light modulators 214. In this way, by controlling the wavelengths and phases of light provided to the plurality of grating antennas 215, the LiDAR apparatus 200 may perform two-dimensional beam scanning for the front of the LiDAR apparatus 200.

The optical receiver 220 receives light reflected from an object OBJ in front. The optical receiver 220 may receive all light from the outside toward the LIDAR apparatus 200, but may also be configured to receive light from a direction in which the optical transmitter 210 transmits light. For example, the optical receiver 220 may be implemented using an optical phased array method.

The processor 250 may control operations of the tunable laser light source 100, the optical transmitter 210, and the optical receiver 220, and may extract distance information or speed information about an external object OBJ based on a signal received from the optical detector 230. For example, the processor 250 may extract distance information or speed information about an external object OBJ using a time of flight (TOF) method or a frequency modulated continuous wave (FMCW) method. The processor 250 may be implemented as, for example, a dedicated semiconductor chip, or may be implemented as software executable on a computer and stored in a recording medium. In another example, the processor 250 may be implemented as a programmable logic controller (PLC) or a field-programmable gate array (FPGA). In addition, the processor 250 may be mounted on one substrate 201 together with the tunable laser light source 100, the optical transmitter 210, the optical receiver 220, and the optical detector 230, or may be mounted on a separate substrate from each other.

In one example, the tunable laser light source 100, the optical transmitter 210, the optical receiver 220, and the optical detector 230 may be implemented on a single substrate 201 as a single photonic integrated circuit (PIC). For example, similar to the substrate 101 shown in FIG. 2, the substrate 201 of the LIDAR apparatus 200 may include a semiconductor layer and a dielectric layer disposed on the semiconductor layer. In addition, the LiDAR apparatus 200 may include a waveguide layer disposed on the substrate 201 and a cladding layer disposed on the waveguide layer similar to the cross-sectional structure of the tunable laser light source 100 shown in FIG. 2. In other words, the substrate 201 of the LiDAR apparatus 200 is the substrate 101 of the tunable laser light source 100, and the tunable laser light source 100 may be integrally formed on the substrate 201 of the LiDAR apparatus 200.

The waveguide layer of the LiDAR apparatus 200 may include a plurality of light splitters 211, a plurality of optical waveguides 212, and a plurality of grating antennas 215. For example, the plurality of light splitters 211, the plurality of optical waveguides 212, and the plurality of lattice antennas 215 may be formed by patterning the waveguide layer. A plurality of optical amplifiers 213 and a plurality of optical modulators 214 may be disposed on the waveguide layer. For example, the plurality of optical amplifiers 213 and the plurality of optical modulators 214 may be formed by stacking a lower contact layer, a gain material layer, and an upper contact layer on the optical waveguide 212. In addition, the cladding layer 103 shown in FIG. 2 may be disposed to cover the plurality of light splitters 211, the plurality of optical waveguides 212, the plurality of grating antennas 215, the plurality of optical amplifiers 213, and the plurality of optical modulator 214.

In this case, the thermal isolation structure 130 and thermal management device 140 shown in FIGS. 1 to 10 may also be applied to the LiDAR apparatus 200. For example, in order to thermally isolate the plurality of optical amplifiers 213 and the plurality of optical modulators 214 of the LiDAR apparatus 200 from each other, a plurality of thermal isolation structures 240 may be formed by removing a part of the waveguide layer through etching. Referring to FIG. 11, similar to the thermal isolation structure 130 shown in FIG. 1, the thermal isolation structure 240 may be disposed between two optical amplifiers adjacent in the first direction among the plurality of optical amplifiers and/or between two light modulators adjacent in the first direction among the plurality of light modulators 214, respectively. Alternatively, like the first to third thermal isolation structures 130*a*, 130*b*, and 130*c* shown in FIG. 5, the thermal isolation structure 240 may be disposed on both sides of each optical amplifier 213 and/or each optical modulator 214 in the first direction, respectively. In each thermal isolation structure 240, the waveguide layer is disconnected and separated in the first direction, and an upper surface of the substrate 201 may be exposed outside the waveguide layer. Thus, the upper surface of the substrate 201 may directly contact the cladding layer 103 shown in FIG. 2.

Each of the thermal isolation structures 240 may continuously extend in the second direction to face both the optical amplifier 213 and the optical modulator 214 adjacent in the first direction. A length of each thermal isolation structure 240 in the second direction may be greater than the sum of a length of each optical amplifier 213 in the second direction and a length of each optical modulator 214 in the second direction. In addition, a first end of each thermal isolation structure 240 in the second direction protrudes further than a first end of each optical amplifier 213, and a second end of each thermal isolation structure 240 opposite the first end in the second direction may protrude further than a second end of each light modulator 214.

Figure 12:
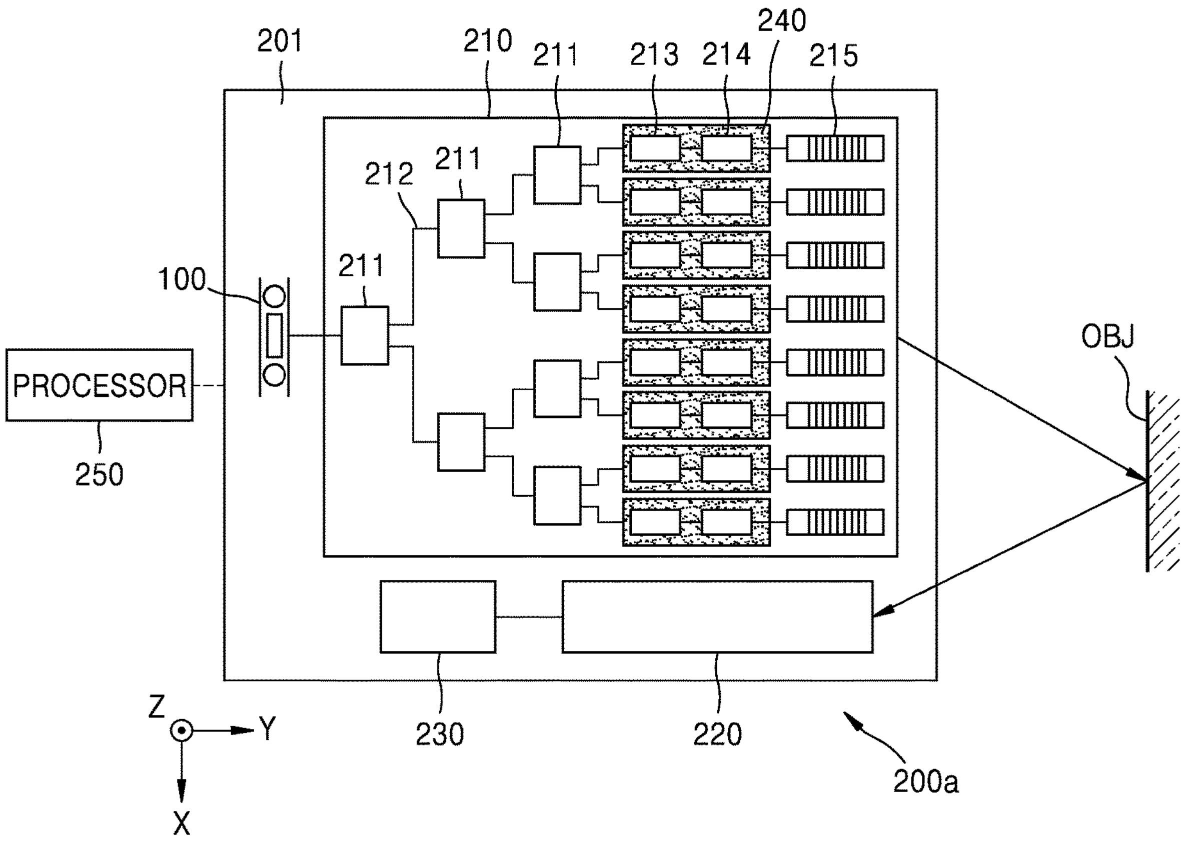
FIG. 12 is a schematic block diagram showing a configuration of a LIDAR apparatus according to another embodiment.

FIG. 12 is a schematic block diagram showing a configuration of a LiDAR apparatus 200*a* according to another embodiment. Referring to FIG. 12, the LiDAR apparatus 200*a* may include a plurality of thermal isolation structures 240 to surround a pair of one optical amplifier 213 and one optical modulator 214 adjacent to each other in the second direction among the plurality of optical amplifiers 213 and the plurality of optical modulators 214. In FIG. 12, that the depiction of each of the plurality of thermal isolation structures 240 surrounding a pair of one optical amplifier and one optical modulator adjacent to each other in the second direction is merely an example, and is not intended to limit the embodiment. For example, each of the plurality of thermal isolation structures 240 may be disposed to individually surround one of the plurality of optical amplifiers 213 and individually surround one of the plurality of optical modulators 214. Alternatively, one thermal isolation structure 240 may be disposed to surround all the plurality of optical amplifiers 213 and the plurality of optical modulators 214.

As described above, the thermal isolation structures 130 and 240 may suppress or reduce thermal coupling between at least two semiconductor element heat-sources that generate heat during operation and are provided adjacent to each other on the waveguide layer. The thermal isolation structures 130 and 240 may be formed by removing a portion of the waveguide layer between two adjacent semiconductor element heat-sources on the waveguide layer. In other words, the waveguide layer may be etched to expose the substrate underneath the waveguide layer, effectively disconnecting the waveguide layer between the two adjacent semiconductor element heat-sources. By removing and disconnecting a part of the waveguide layer, transfer of heat generated from one heat source of a semiconductor element to another heat source of a semiconductor element through a material of the waveguide layer may be suppressed or reduced. So far, an optical amplifier and an optical modulator have been mainly described as semiconductor element heat-sources, but semiconductor element heat-sources may include various other semiconductor elements that generate heat during operation. In other words, the thermal isolation structures 130 and 240 may be applied to electronic apparatuses including various semiconductor element heat-sources in addition to optical amplifiers and optical modulators.

Figure 13:
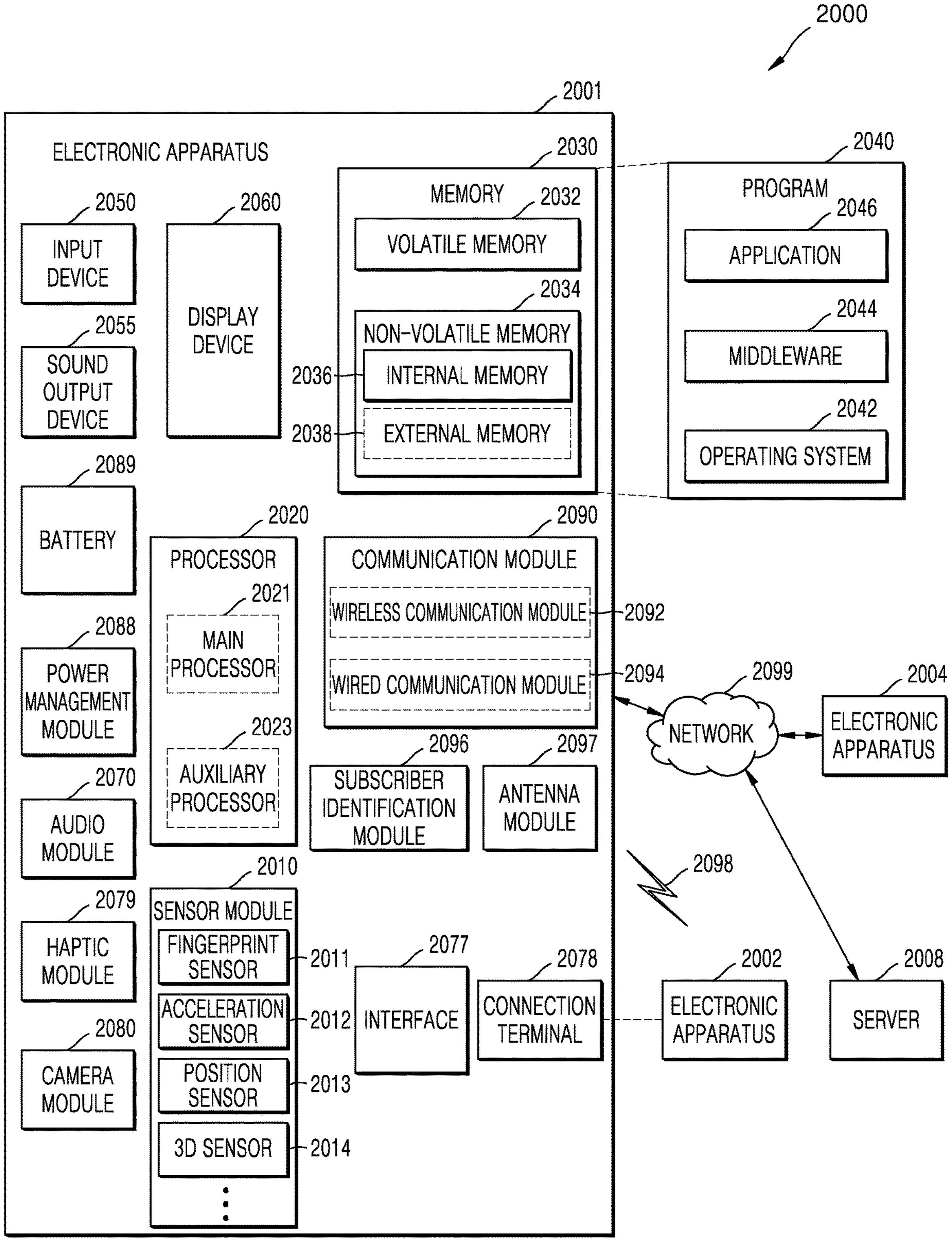
FIG. 13 is a schematic block diagram showing a configuration of an electronic apparatus including a LIDAR apparatus according to an embodiment.

The LiDAR apparatus described above may be applied to various electronic apparatuses for detecting a distance to an external object or acquiring a three-dimensional (3D) image. FIG. 13 is a schematic block diagram showing a configuration of an electronic apparatus including a LIDAR apparatus according to an embodiment. Referring to FIG. 13, in a network environment 2000, an electronic device 2001 may communicate with other electronic apparatus 2002 through a first network 2098 (a short-distance wireless communication network, etc.) or communicate with another electronic apparatus 2004 and/or server 2008 via a second network 2099 (a long-distance wireless communication network, etc.). The electronic apparatus 2001 may communicate with the electronic apparatus 2004 through the server 2008. The electronic apparatus 2001 may include a processor 2020, a memory 2030, an input device 2050, an audio output device 2055, a display device 2060, an audio module 2070, a sensor module 2010, an interface 2077, a haptic module 2079, a camera module 2080, a power management module 2088, a battery 2089, a communication module 2090, a subscriber identification module 2096, and/or an antenna module 2097. In the electronic apparatus 2001, some of these components (such as the display device 2060) may be omitted or other components may be added. Some of these components may be implemented as a single integrated circuit. For example, a fingerprint sensor 2011 of the sensor module 2010, an iris sensor, or an illumination sensor may be implemented by being embedded in the display device 2060 (a display, etc.).

The processor 2020 may control one or a plurality of other components (hardware, software components, etc.) of the electronic apparatus 2001 connected to the processor 2020 by executing software (a program 2040, etc.), and may perform various data processing or calculations. As part of data processing or calculations, the processor 2020 may load commands and/or data received from other components (the sensor module 2010, the communication module 2090, etc.) into a volatile memory 2032 and process the commands and/or data stored in the volatile memory 2032 and resulting data may be stored in a non-volatile memory 2034. The processor 2020 may include a main processor 2021 (central processing unit, application processor, etc.) and an auxiliary processor 2023 (graphics processing unit, image signal processor, sensor hub processor, communication processor, etc.) that may be operated independently or together with the main processor 2021. The auxiliary processor 2023 may use less power than the main processor 2021 and perform specialized functions.

The auxiliary processor 2023 may control functions and/or states related to some of the components (the display device 2060, the sensor module 2010, the communication module 2090, etc.) of the electronic apparatus 2001 in place of the main processor 2021 while the main processor 2021 is in an inactive state (a sleep state) or together with the main processor 2021 while the main processor 2021 is in an active state (an application execution state). The auxiliary processor 2023 (an image signal processor, a communication processor, etc.) may be implemented as part of other functionally related components (the camera module 2080, the communication module 2090, etc.).

The memory 2030 may store various data required by components (the processor 2020, the sensor module 2010, etc.) of the electronic apparatus 2001. Data may include, for example, input data and/or output data for software (the program 2040, etc.) and instructions related the software. The memory 2030 may include a volatile memory 2032 and/or a non-volatile memory 2034.

The program 2040 may be stored as software in the memory 2030 and may include an operating system 2042, middleware 2044, and/or applications 2046.

The input device 2050 may receive commands and/or data to be used for a component (the processor 2020, etc.) of the electronic apparatus 2001 from the outside of the electronic apparatus 2001 (a user, etc.). The input device 2050 may include a microphone, mouse, keyboard, and/or digital pen (a stylus pen, etc.).

The audio output device 2055 may output sound signals to the outside of the electronic apparatus 2001. The audio output device 2055 may include a speaker and/or a receiver. The speaker may be used for general purposes, such as multimedia playback or recording playback, and the receiver may be used to receive an incoming call. The receiver may be coupled as a part of the speaker or implemented as an independent separate device.

The display device 2060 may visually provide information to the outside of the electronic apparatus 2001. The display device 2060 may include a display, a hologram device, or a projector and a control circuit for controlling the device. The display device 2060 may include a touch circuitry set to sense a touch and/or a sensor circuit (such as a pressure sensor) set to measure the strength of a force generated by a touch.

The audio module 2070 may convert sound into an electrical signal or vice versa. The audio module 2070 may obtain a sound through the input device 2050 or output a sound through a speaker and/or headphone of another electronic apparatus (such as the electronic apparatus 2002) connected directly or wirelessly to the audio output device 2055 and/or the electronic apparatus 2001.

The sensor module 2010 may detect an operation state (power, temperature, etc.) of the electronic apparatus 2001 or an external environmental state (user state, etc.), and generates an electrical signal and/or data value corresponding to the detected state. The sensor module 2010 may include a fingerprint sensor 2011, an acceleration sensor 2012, a position sensor 2013, a 3D sensor 2014, and the like, and besides above, may include an iris sensor, a gyro sensor, an air pressure sensor, a magnetic sensor, a grip sensor, a proximity sensor, a color sensor, an IR (Infrared) sensor, a biological sensor, a temperature sensor, a humidity sensor, and/or an illuminance sensor.

The 3D sensor 2014 senses a shape and movement of an object by irradiating a predetermined light onto the object and analyzing light reflected from the object and may include the LiDAR apparatus 200 according to the embodiment described above.

The interface 2077 may support at least one designated protocol that may be used to connect the electronic apparatus 2001 directly or wirelessly to another electronic apparatus (e.g., the electronic apparatus 2002). The interface 2077 may include a high-definition multimedia interface (HDMI), a universal serial bus (USB) interface, an SD card interface, and/or an audio interface.

A connection terminal 2078 may include a connector through which the electronic apparatus 2001 may be physically connected to another electronic apparatus (such as the electronic apparatus 2002). The connection terminal 2078 may include an HDMI connector, a USB connector, an SD card connector, The haptic module 2079 may convert an electrical signal into mechanical stimuli (vibration, movement, etc.) or electrical stimuli that a user may recognize through tactile or kinesthetic senses. The haptic module 2079 may include a motor, a piezoelectric element, and/or an electrical stimulation device.

The camera module 2080 may capture still images and moving images. The camera module 2080 may include a lens assembly including one or more lenses, image sensors, image signal processors, and/or flashes. The lens assembly included in the camera module 2080 may collect light emitted from an object that is an image capture target.

The power management module 2088 may manage power supplied to the electronic apparatus 2001. The power management module 388 may be implemented as part of a Power Management Integrated Circuit (PMIC).

The battery 2089 may supply power to components of the electronic apparatus 2001. The battery 2089 may include a non-rechargeable primary cell, a rechargeable secondary cell, and/or a fuel cell.

The communication module 2090 may establish a direct (wired) communication channel and/or wireless communication channel between the electronic apparatus 2001 and other electronic apparatuses (electronic apparatus 2002, electronic apparatus 2004, server 2008, etc.), may support communication through the established communication channel. The communication module 2090 may include one or more communication processors that are independently operated from the processor 2020 (application processor, etc.) and support direct communication and/or wireless communication. The communication module 2090 may include a wireless communication module 2092 (a cellular communication module, a short-range wireless communication module, a Global Navigation Satellite System (GNSS), etc.) communication module) and/or a wired communication module 2094 (a Local Area Network (LAN) communication module, a power line communication module, etc.). Among these communication modules, a corresponding communication module may communicate with other electronic devices through the first network 2098 (a short-range communication network, such as Bluetooth, WiFi Direct, or Infrared Data Association (IrDA)) or the second network 2099 (a telecommunication network, such as a cellular network, the Internet, or a computer network (LAN) and WAN, etc.). The various types of communication modules may be integrated into one component (a single chip, etc.) or implemented as a plurality of components (plural chips) separate from each other. The wireless communication module 2092 may identify and authenticate the electronic apparatus 2001 within a communication network, such as the first network 2098 and/or the second network 2099 by using subscriber information (such as, International Mobile Subscriber Identifier (IMSI)) stored in a subscriber identification module 2096.

The antenna module 2097 may transmit or receive signals and/or power to and from the outside (other electronic devices, etc.). The antenna may include a radiator having a conductive pattern formed on a substrate (PCB, etc.). The antenna module 2097 may include one or a plurality of antennas. When a plurality of antennas is included in the antenna module 2097, an antenna suitable for a communication method used in a communication network, such as the first network 2098 and/or the second network 2099 from among the plurality of antennas may be selected by the communication module 2090. Signals and/or power may be transmitted or received between the communication module 2090 and another electronic device through the selected antenna. In addition to the antenna, other components (an RFIC, etc.) may be included as a part of the antenna module 2097.

Some of the components are connected to each other through a communication method between peripheral devices (a bus, a General-Purpose Input and Output (GPIO), a Serial Peripheral Interface (SPI), a Mobile Industry Processor Interface (MIPI), etc.), and may interchange signals (commands, data, etc.).

The command or data may be transmitted or received between the electronic apparatus 2001 and the external electronic apparatus 2004 through the server 2008 connected to the second network 2099. The other electronic apparatuses 2002 and 2004 may be the same or different types of electronic apparatus 2001. All or some of operations performed in the electronic apparatus 2001 may be performed in one or more of the other electronic apparatuses 2002, 2004, and 2008. For example, when the electronic apparatus 2001 needs to perform a function or service, the electronic apparatus 2001 may request one or more other electronic devices to perform part or all function or service instead of executing the function or service itself. One or more other electronic devices receiving the request may execute an additional function or service related to the request, and transmit a result of the execution to the electronic apparatus 2001. For this purpose, cloud computing, distributed computing, and/or client-server computing technologies may be used.

Figure 14:
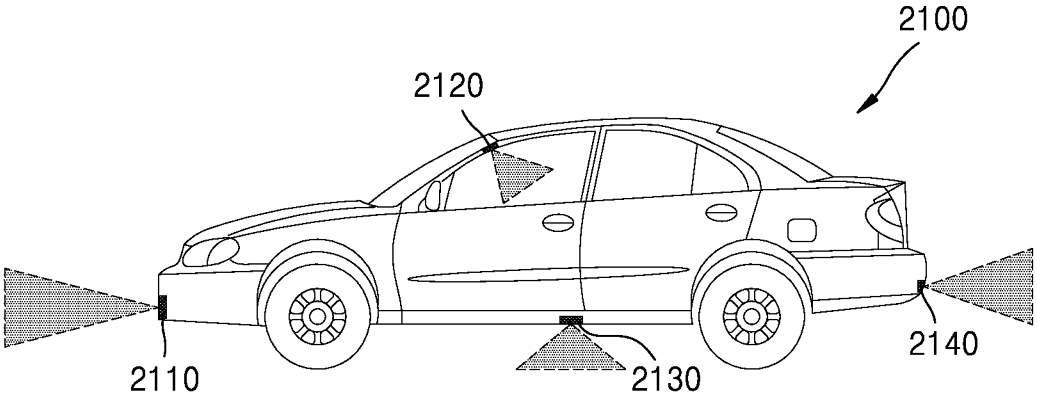
FIG. 14 is a diagram schematically showing an example in which a LIDAR apparatus is applied to a vehicle.

FIG. 14 is a diagram schematically showing an example in which LiDAR apparatuses are applied to a vehicle 2100. Referring to FIG. 14, the vehicle 2100 may include a plurality of LiDAR apparatuses 2110, 2120, 2130, and 2140 disposed in various locations. The vehicle 2100 may provide various pieces of information about the surroundings of the vehicle 2100 to the driver using a plurality of LiDAR apparatuses 2110, 2120, 2130, and 2140, and may provide information necessary for autonomous driving by automatically recognizing objects or people around the vehicle 2100. The plurality of LiDAR apparatuses 2110, 2120, 2130, and 2140 may be the LIDAR apparatus 200 according to the embodiment shown in FIG. 11.

A tunable laser light source and a LiDAR apparatus including the same have been described with reference to the embodiment shown in the drawings. However, it will be understood by those of ordinary skill in the art that various changes in form and details may be made therein without departing from the spirit and scope of the disclosure. Therefore, the embodiments should be considered in descriptive sense only and not for purposes of limitation. The scope of the disclosure is defined not by the detailed description of the disclosure but by the appended claims, and all differences within the scope will be construed as being included in the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A tunable laser light source comprising:

a substrate;

a waveguide layer disposed on the substrate, and comprising a first optical waveguide and a second optical waveguide that are spaced apart from each other in a first direction and that extend in a second direction perpendicular to the first direction;

a first optical amplifier provided on the first optical waveguide;

a second optical amplifier provided on the second optical waveguide and facing the first optical amplifier at a distance in the first direction; and a thermal isolation structure that is provided between the first optical amplifier and the second optical amplifier in the first direction, a first ring resonator disposed to face a first end of the thermal isolation structure in the second direction between the first and second optical waveguides in the first direction; and a second ring resonator disposed to face a second end of the thermal isolation structure opposite to the first end in the second direction between the first and second optical waveguides in the first direction, wherein, in the thermal isolation structure, the waveguide layer is disconnected in the first direction by an etched-out portion such that an upper surface of the substrate is exposed at a bottom of the etched-out portion outside the waveguide layer, and wherein the waveguide layer surrounds the etched-out portion between the first optical amplifier and the second optical amplifier in the first direction and between the first ring resonator and the second ring resonator in the second direction.

2. The tunable laser light source of claim 1, wherein a length of the thermal isolation structure in the second direction is greater than a length of the first optical amplifier in the second direction and a length of the second optical amplifier in the second direction.

3. The tunable laser light source of claim 2, wherein the first end of the thermal isolation structure protrudes in the second direction beyond a first end of the first optical amplifier and a first end of the second optical amplifier, and the second end of the thermal isolation structure, which is opposite to the first end, protrudes in the second direction beyond a second end of the first optical amplifier and a second end of the second optical amplifier.

4. The tunable laser light source of claim 1, wherein a distance between the first end of the thermal isolation structure and the first ring resonator in the second direction is less than a distance between the first end of the first optical amplifier and the first ring resonator and a distance between the first end of the second optical amplifier and the first ring resonator, and a distance between the second end of the thermal isolation structure and the second ring resonator in the second direction is less than a distance between the second end of the first optical amplifier and the second ring resonator and a distance between the second end of the second optical amplifier and the second ring resonator.

5. The tunable laser light source of claim 1, wherein the thermal isolation structure is a first thermal isolation structure disposed between a first side surface of the first optical amplifier and a first side surface of the second optical amplifier in the first direction, wherein the tunable laser light source further includes:

a second thermal isolation structure disposed to face a second side of the first optical amplifier opposite the first side of the first optical amplifier in the first direction and extending in the second direction;

a third thermal isolation structure disposed to face a second side surface of the second optical amplifier opposite the first side surface of the second optical amplifier in the first direction and extending in the second direction;

a fourth thermal isolation structure disposed to face a side surface of the first ring resonator in the second direction; and a fifth thermal isolation structure disposed to face a side surface of the second ring resonator in the second direction.

6. The tunable laser light source of claim 5, wherein the first thermal isolation structure, the second thermal isolation structure, and the third thermal isolation structure are spaced apart from each other with an interval and are parallel to one another in the first direction, wherein a length of the second thermal isolation structure in the second direction and a length of the third thermal isolation structure in the second direction are greater than a length of the first thermal isolation structure in the second direction.

7. The tunable laser light source of claim 5, wherein the first ring resonator is disposed between the first thermal isolation structure and the fourth thermal isolation structure in the second direction, and the second ring resonator is disposed between the first thermal isolation structure and the fifth thermal isolation structure in the second direction.

8. The tunable laser light source of claim 1, wherein a thermal conductivity of the thermal isolation structure is less than a thermal conductivity of the waveguide layer.

9. The tunable laser light source of claim 1, further comprising a cladding layer on the waveguide layer, wherein the thermal isolation structure is a region filled with the cladding layer between the first and second optical amplifiers.

10. The tunable laser light source of claim 9, wherein in the thermal isolation structure, the upper surface of the substrate and the cladding layer are in direct contact with each other.

11. The tunable laser light source of claim 9, wherein the cladding layer has a refractive index less than a refractive index of the waveguide layer, and the cladding layer has a thermal conductivity less than a thermal conductivity of the waveguide layer.

12. The tunable laser light source of claim 1, wherein the first optical amplifier includes a first lower contact layer disposed on the first optical waveguide, a first gain material layer disposed on the first lower contact layer, and a first upper contact layer disposed on the first gain material layer, and the second optical amplifier includes a second lower contact layer disposed on the second optical waveguide, a second gain material layer disposed on the second lower contact layer, and a second upper contact layer disposed on the second gain material layer.

13. The tunable laser light source of claim 12, further comprising a thermal management device disposed in contact with the first upper contact layer and the second upper contact layer.

14. The tunable laser light source of claim 12, further comprising:

a thermal management device disposed on a lower surface of the substrate;

a first thermal conductive plug connected between the first lower contact layer and the thermal management device and extending in a third direction perpendicular to the first and second directions;

a second thermal conductive plug connected between the first upper contact layer and the thermal management device and extending in the third direction;

a third thermal conductive plug connected between the second lower contact layer and the thermal management device and extending in the third direction; and a fourth thermal conductive plug connected between the second upper contact layer and the thermal management device and extending in the third direction, wherein the thermal management device is configured to individually cool the first to fourth thermal conductive plugs.

15. The tunable laser light source of claim 12, further comprising:

a thermal management device disposed on a lower surface of the substrate;

a first thermal conductive member extending between the thermal management device and the first optical waveguide through the substrate in a third direction perpendicular to the first and second directions; and a second thermal conductive member extending between the thermal management device and the second optical waveguide through the substrate in the third direction perpendicular to the first and second directions.

16. A light detection and ranging (LiDAR) apparatus comprising:

a substrate;

a waveguide layer disposed on the substrate, and comprising a plurality of pairs of optical amplifiers and optical modulators, wherein the plurality of pairs are spaced apart from each other in a first direction, and each pair of an optical amplifier and an optical modulator, among the plurality of pairs, is arranged in a second direction that is perpendicular to the first direction; and a thermal isolation structure configured to thermally isolate the plurality of pairs from each other in the first direction, wherein in the thermal isolation structure, the waveguide layer is disconnected in the first direction by an etched-out portion of the thermal isolation structure such that an upper surface of the substrate is exposed at a bottom of the etched-out portion outside of the waveguide layer, wherein the waveguide layer surrounds the etched-out portion.

17. The LiDAR apparatus of claim 16, wherein the thermal isolation structure is disposed between two adjacent pairs in the first direction among the plurality of pairs.

18. The LiDAR apparatus of claim 16, wherein the thermal isolation structure is arranged to surround a pair of one optical amplifier and one optical modulator adjacent to each other in the second direction among the plurality of pairs of optical amplifiers and an optical modulators.

19. An electronic apparatus comprising:
a substrate;
a waveguide layer disposed on the substrate; and
at least two semiconductor elements provided on the waveguide layer to face in a first direction and configured to generate heat during operation;
a thermal isolation structure that is provided between the at least two semiconductor elements in the first direction;
a first ring resonator disposed to face a first end of the thermal isolation structure in a second direction perpendicular to the first direction between the at least two semiconductor elements in the first direction; and
a second ring resonator disposed to face a second end of the thermal isolation structure opposite to the first end in the second direction between the at least two semiconductor elements in the first direction,
wherein, in the thermal isolation structure, the waveguide layer is disconnected in the first direction by an etched-out portion such that an upper surface of the substrate is exposed at a bottom of the etched-out portion outside the waveguide layer, and
wherein the waveguide layer surrounds the etched-out portion between the at least two semiconductor elements in the first direction and between the first ring resonator and the second ring resonator in the second direction.

* * * * *